(12) United States Patent
Chung et al.

(10) Patent No.: US 11,004,994 B2
(45) Date of Patent: May 11, 2021

(54) SOLAR CELL AND METHOD OF MANUFACTURING THE SAME

(71) Applicant: LG ELECTRONICS INC., Seoul (KR)

(72) Inventors: Indo Chung, Seoul (KR); Juhong Yang, Seoul (KR); Eunjoo Lee, Seoul (KR); Mihee Heo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 289 days.

(21) Appl. No.: 15/154,532

(22) Filed: May 13, 2016

(65) Prior Publication Data

US 2016/0336468 A1   Nov. 17, 2016

(30) Foreign Application Priority Data

May 13, 2015  (KR) .................. 10-2015-0066630
Apr. 5, 2016  (KR) .................. 10-2016-0041767

(51) Int. Cl.
   *H01L 31/02*      (2006.01)
   *H01L 31/0216*    (2014.01)
   (Continued)

(52) U.S. Cl.
   CPC ...... *H01L 31/049* (2014.12); *H01L 31/02008* (2013.01); *H01L 31/02167* (2013.01);
   (Continued)

(58) Field of Classification Search
   CPC ......... H01L 31/0682; H01L 31/022425; H01L 31/022441; H01L 31/022458;
   (Continued)

(56) References Cited

U.S. PATENT DOCUMENTS

2008/0017243 A1 * 1/2008 De Ceuster ..... H01L 31/022425
                                                      136/255
2008/0061293 A1 * 3/2008 Ribeyron ........ H01L 31/022441
                                                       257/53
(Continued)

FOREIGN PATENT DOCUMENTS

| CN | 101305454 A | 11/2008 |
| EP | 2903030 A1 | 8/2015 |
| JP | 2006-73617 A | 3/2006 |
| WO | WO-2014163043 A1 * 10/2014 ..... H01L 31/022441 |

OTHER PUBLICATIONS

JP 2006-073617 English machine translation (Year: 2006).*
English machine translation for WO2014163043A1 (Year: 2014).*

*Primary Examiner* — Andrew J Golden
(74) *Attorney, Agent, or Firm* — Birch, Stewart, Kolasch & Birch, LLP

(57) ABSTRACT

Disclosed is a solar cell including a semiconductor substrate, a conductive area including a first conductive area and a second conductive area formed on one surface of the semiconductor substrate, a passivation film formed on the conductive area, the passivation film having a contact hole, a protective film formed on the conductive area inside the contact hole, the protective film being formed on at least one of at least a portion of an inner side surface of the contact hole and the passivation film, and an electrode electrically connected to the conductive area through the contact hole with the protective film interposed therebetween.

4 Claims, 10 Drawing Sheets

(51) Int. Cl.
*H01L 31/0224* (2006.01)
*H01L 31/0236* (2006.01)
*H01L 31/0747* (2012.01)
*H01L 31/049* (2014.01)
*H01L 31/18* (2006.01)

(52) U.S. Cl.
CPC .. *H01L 31/02168* (2013.01); *H01L 31/02366* (2013.01); *H01L 31/022441* (2013.01); *H01L 31/0747* (2013.01); *H01L 31/1804* (2013.01); *H01L 31/1868* (2013.01); *Y02E 10/547* (2013.01); *Y02P 70/50* (2015.11)

(58) Field of Classification Search
CPC ......... H01L 31/0747; H01L 31/022433; H01L 31/02363; H01L 31/068; H01L 31/02366
USPC ................................................. 136/243–265
See application file for complete search history.

(56) References Cited

U.S. PATENT DOCUMENTS

| | | | |
|---|---|---|---|
| 2009/0008787 A1* | 1/2009 | Wenham | H01L 31/022425 257/773 |
| 2009/0223562 A1* | 9/2009 | Niira | H01L 31/022441 136/256 |
| 2010/0139745 A1* | 6/2010 | Cousins | H01L 31/022425 136/255 |
| 2010/0224240 A1 | 9/2010 | Bateman et al. | |
| 2011/0041911 A1 | 2/2011 | Lee et al. | |
| 2011/0140226 A1* | 6/2011 | Jin | H01L 31/02363 257/460 |
| 2011/0197965 A1* | 8/2011 | Finarov | H01L 31/022425 136/256 |
| 2014/0199806 A1* | 7/2014 | Lennon | H01L 31/0682 438/98 |
| 2014/0295614 A1 | 10/2014 | Lee et al. | |
| 2014/0311567 A1* | 10/2014 | Choi | H01L 31/02167 136/258 |

* cited by examiner

SOLAR CELL AND METHOD OF MANUFACTURING THE SAME

CROSS-REFERENCE TO RELATED APPLICATION

This application claims the priority benefit of Korean Patent Application No. 10-2015-0066630, filed on May 13, 2015 and Korean Patent Application No. 10-2016-0041767 filed on Apr. 5, 2016 in the Korean Intellectual Property Office, the disclosures of which are incorporated herein by reference.

BACKGROUND OF THE INVENTION

Field of the Invention

Embodiments of the present invention relate to a solar cell and a method of manufacturing the same, and more particularly to a back contact solar cell and a method of manufacturing the same.

Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

Solar cells may be manufactured by forming various layers and electrodes based on a design. The efficiency of solar cells may be determined by the design of the various layers and electrodes. In order for solar cells to be commercialized, the problem of low efficiency needs to be overcome, and thus, there is a demand to design the various layers and electrodes so as to maximize the efficiency of the solar cells.

An insulation layer is formed over a photoelectric converter in consideration of passivation, insulation, etc. Subsequently, a contact hole is formed in the insulation layer for electrical connection between the photoelectric converter and an electrode, and in turn the electrode is formed in the contact hole. Various methods may be applied to form the contact hole. Among these methods, there is a method of forming the contact hole by irradiating the insulation layer with a laser in the instance where the electrode is a microelectrode. However, because the formation of the contact hole via laser irradiation causes heat generated by the laser to directly reach a portion of the photoelectric converter in the area in which the contact hole is formed, the corresponding portion may be damaged, or the properties thereof may be deteriorated by the heat.

SUMMARY OF THE INVENTION

Therefore, embodiments of the present invention have been made in view of the above problems, and it is an object of the embodiments of the present invention to provide a solar cell, the properties of which are not damaged or deteriorated even if a process using a laser is applied, thus being highly efficient, and a method of manufacturing the same.

In accordance with one aspect of the present invention, the above and other objects can be accomplished by the provision of a solar cell including a semiconductor substrate, a conductive area including a first conductive area and a second conductive area formed on one surface of the semiconductor substrate, a passivation film formed on the conductive area, the passivation film having a contact hole, a protective film formed on the conductive area inside the contact hole, the protective film being formed over at least one of at least a portion of an inner side surface of the contact hole and the passivation film, and an electrode electrically connected to the conductive area through the contact hole with the protective film interposed therebetween.

In accordance with another aspect of the present invention, there is provided a solar cell including a semiconductor substrate, a conductive area including a first conductive area and a second conductive area formed on one surface of the semiconductor substrate, a passivation film formed on the conductive area, the passivation film having a contact hole, a protective film formed on the conductive area inside the contact hole, and an electrode electrically connected to the conductive area through the contact hole with the protective film interposed therebetween, wherein the passivation film includes a first layer disposed on the conductive area and a second layer disposed on the first layer, the second layer comprising a material different from that of the first layer, wherein the contact hole includes a first contact hole region formed in the first layer and a second contact hole region formed in the second layer, the second contact hole region communicating with the first contact hole region, and wherein the first contact hole region includes a region having a larger size than the second contact hole region, or a stepped portion is located between an inner side surface thereof and an inner side surface of the second contact hole region.

In accordance with a further aspect of the present invention, there is provided a method of manufacturing a solar cell, the method including forming a conductive area including a first conductive area and a second conductive area on one surface of a semiconductor substrate, forming a passivation film on the conductive area, the passivation film having a contact hole, forming a protective film on the conductive area exposed through the contact hole, and forming an electrode electrically connected to the conductive area through the contact hole of the passivation film with the protective film interposed therebetween.

BRIEF DESCRIPTION OF THE DRAWINGS

The above and other objects, features and other advantages of the embodiments of the present invention will be more clearly understood from the following detailed description taken in conjunction with the accompanying drawings, in which.

DETAILED DESCRIPTION OF THE EMBODIMENTS

Figure 1:
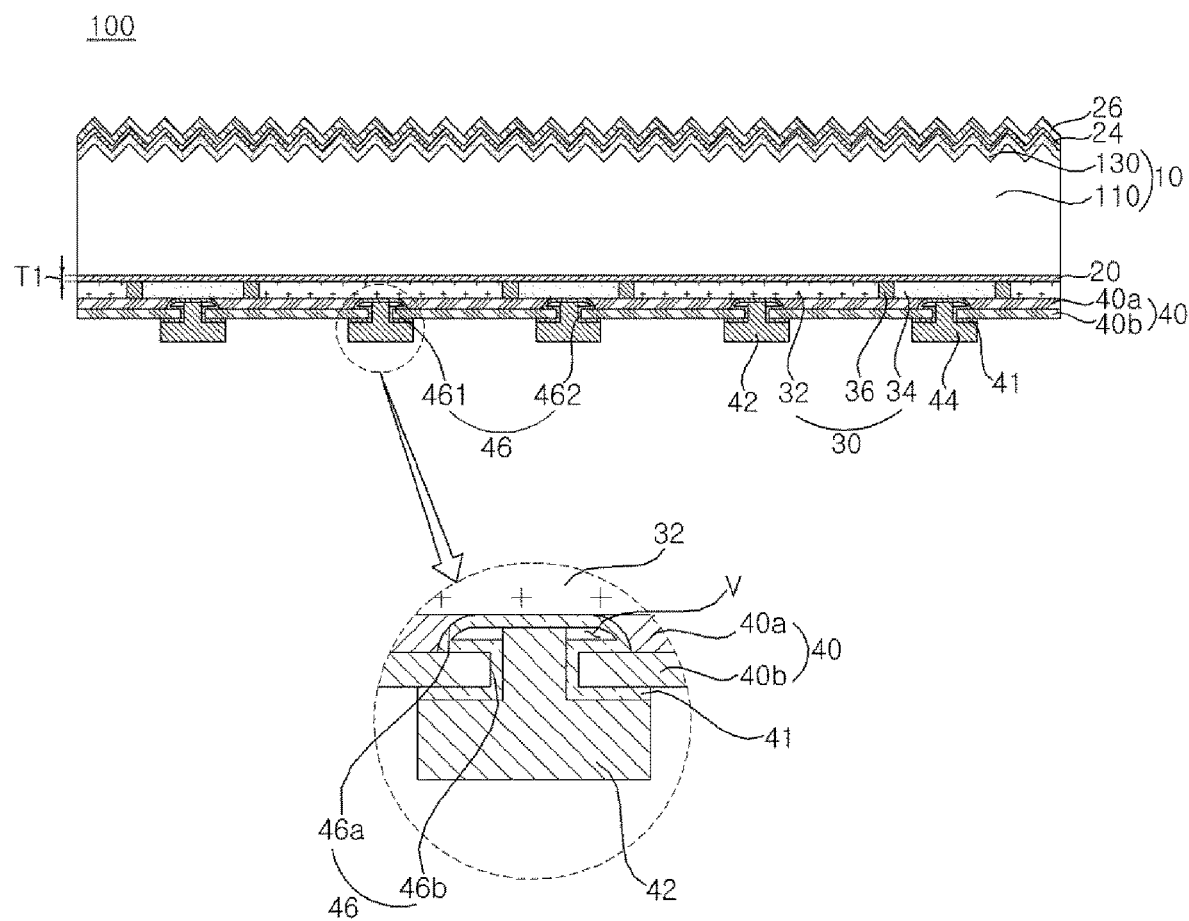
FIG. 1 is a sectional view illustrating a solar cell in accordance with an embodiment of the present invention.

Reference will now be made in detail to the embodiments of the present invention, examples of which are illustrated in the accompanying drawings. However, it will be understood that the present invention should not be limited to the embodiments and may be modified in various ways.

In the drawings, to clearly and briefly explain the embodiments of the present invention, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the embodiments of the present invention are not limited to the illustration of the drawings.

In the specification, when an element is referred to as "including" another element, the element should not be understood as excluding other elements so long as there is no special conflicting description, and the element may include at least one other element. In addition, it will be understood that, when an element such as a layer, film, region or substrate is referred to as being on another element, it can be directly on the other element or intervening elements may also be present. On the other hand, when an element such as a layer, film, region or substrate is referred to as being "directly on" another element, this refers to there being no intervening elements therebetween.

Figure 2:
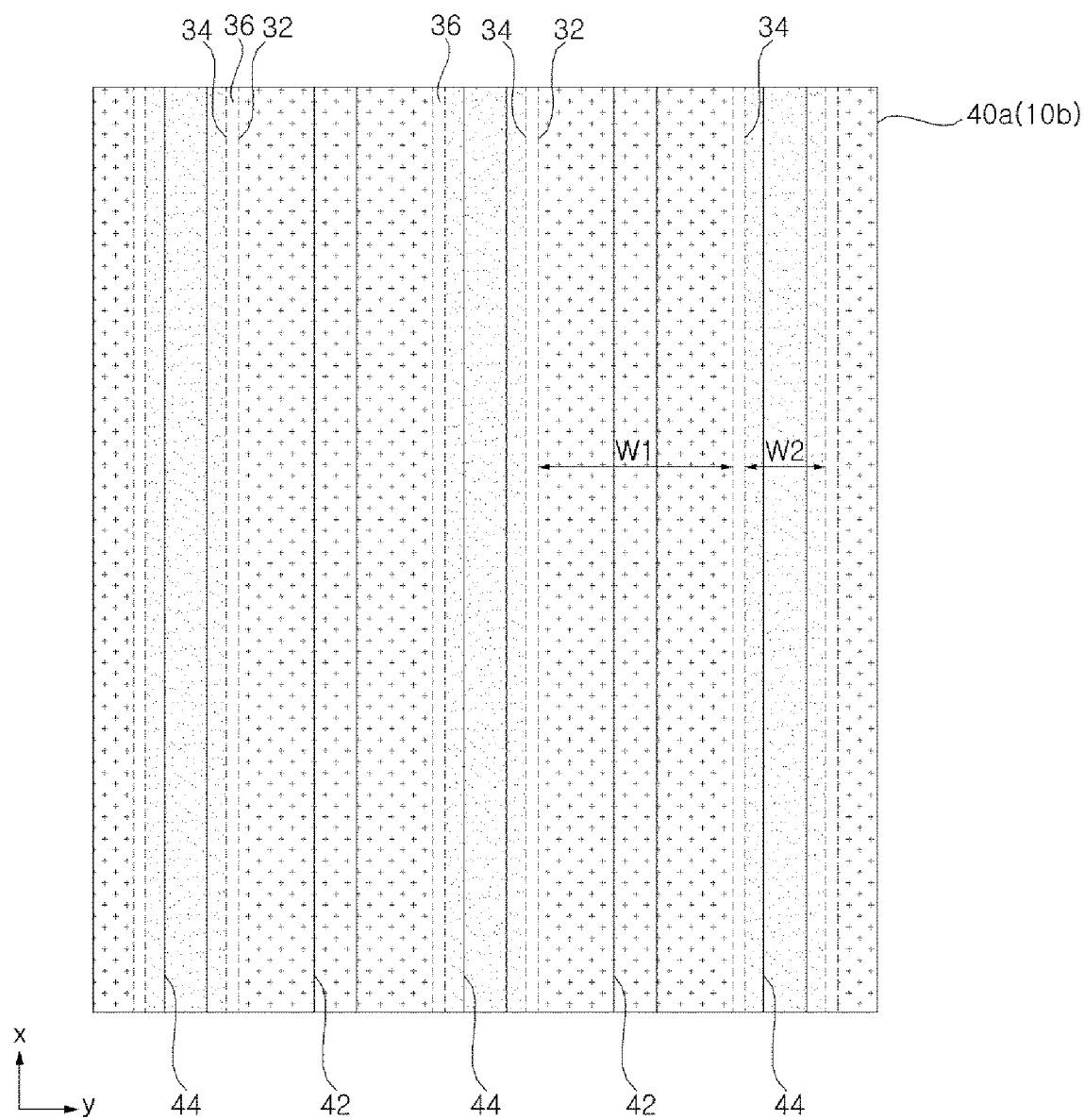
FIG. 2 is a partial rear plan view of the solar cell illustrated in FIG. 1.

FIG. 1 is a sectional view illustrating a solar cell in accordance with an embodiment of the present invention, and FIG. 2 is a partial rear plan view of the solar cell illustrated in FIG. 1.

With reference to FIGS. 1 and 2, the solar cell, designated by reference numeral 100, in accordance with the present embodiment includes a semiconductor substrate 10, a tunneling layer 20 formed on one surface (hereinafter referred to as the "back surface") of the semiconductor substrate 10, conductive areas 32 and 34 located on the tunneling layer 20, a passivation film (hereinafter referred to as a "back passivation film") 40 disposed on the conductive areas 32 and 34, the passivation film 40 having a contact hole 46, a protective film 41 formed on the conductive areas 32 and 34 within the contact hole 46 and formed on the inner side surface of the contact hole 46 (e.g., the side surface of the back passivation film 40 adjacent to the contact hole 46), and electrodes 42 and 44 electrically connected to the conductive areas 32 and 34 through the contact hole 46 of the back passivation film 40 with the protective film 41 interposed therebetween. Here, the conductive areas 32 and 34 include a first conductive area 32 having a first conductive type and a second conductive area 34 having a second conductive type, and the electrodes 42 and 44 include a first electrode 42 connected to the first conductive area 32 and a second electrode 44 connected to the second conductive area 34. In addition, the solar cell 100 may further include, for example, a passivation film (hereinafter referred to as a "front passivation film") 24 disposed on the front surface of the semiconductor substrate 10, and an anti-reflection film 26. The aforementioned components will be described below in more detail.

The semiconductor substrate 10 may include a base area 110, which includes a second conductive dopant at a relatively low doping concentration, thus being of a second conductive type. The base area 110 may be formed of crystalline semiconductors including the second conductive dopant. In one example, the base area 110 may be formed of monocrystalline or polycrystalline semiconductors (e.g. monocrystalline or polycrystalline silicon) including the second conductive dopant. In particular, the base area 110 may be formed of monocrystalline semiconductors including the second conductive dopant (e.g. a monocrystalline semiconductor wafer, and for example, a semiconductor silicon wafer). The use of the base area 110 or the semiconductor substrate 10 having high crystallinity and thus low defects ensures excellent electrical properties.

The second conductive type may be a p-type or an n-type. In one example, when the base area 110 is of an n-type, the p-type first conductive area 32, which forms, along with the base area 110, a junction (e.g. a pn junction with the tunneling layer 20 interposed therebetween) for forming carriers via photoelectric conversion, may be widely formed, which may result in an increased photoelectric conversion area. In addition, in this instance, the first conductive area 32 having a wide area may effectively collect holes, which move relatively slowly, thereby contributing to an increase in photoelectric conversion efficiency. However, the embodiment of the present invention is not limited thereto.

In addition, the semiconductor substrate 10 may include a front field area (or a field area) 130 disposed on the opposite surface (hereinafter referred to as a "front surface") of the semiconductor substrate 10. The front field area 130 may be of the same conductive type as that of the base area 110, and may have a higher doping concentration than that of the base area 110.

The present embodiment illustrates the configuration in which the front field area 130 is configured as a doping area formed by doping the semiconductor substrate 10 with the second conductive dopant at a relatively high doping concentration. As such, the front field area 130 includes crystalline (monocrystalline or polycrystalline) semiconductors of a second conductive type so as to constitute a portion of the semiconductor substrate 10. In one example, the front field area 130 may constitute a portion of a monocrystalline semiconductor substrate (e.g. a monocrystalline silicon wafer substrate) of a second conductive type. At this time, the doping concentration of the front field area 130 may be smaller than the doping concentration of the second conductive area 34, which is of the same second conductive type as that of the front field area 130.

However, the embodiment of the present invention is not limited thereto. Thus, the front field area 130 may be formed by doping a semiconductor layer (e.g. an amorphous semiconductor layer, a microcrystalline semiconductor layer, or a polycrystalline semiconductor layer), separate from the semiconductor substrate 10, with the second conductive dopant. Alternatively, the front field area 130 may be configured as a field area similar to a layer (e.g. the front passivation film 24 and/or the anti-reflection film 26), which is formed adjacent to the semiconductor substrate 10 and is doped with a fixed charge. For example, when the base area 110 is of an n-type, the front passivation film 24 may be formed of an oxide having a negative fixed charge (e.g. an aluminum oxide) so as to form an inversion layer on the surface of the base area 110. Thereby, the front passivation film 24 may be used as a field area. In this instance, the semiconductor substrate 10 may include only the base area 110 without a separate doping area, which may minimize defects of the semiconductor substrate 10. Various other configurations of the front field area 130 may be formed using various other methods.

In the present embodiment, the front surface of the semiconductor substrate 10 may be subjected to texturing, so as to have protrusions in the form of, for example, pyramids. The texture formed on the semiconductor substrate 10 may have a given shape (e.g. a pyramidal shape) having an outer surface formed on a specific crystal face of semiconductors. When the roughness of, for example, the front surface of the semiconductor substrate 10 is increased by the protrusions formed on the front surface via texturing, it is possible to reduce the reflectance of light introduced through the front surface of the semiconductor substrate 10. Accordingly, the quantity of light, which reaches the pn junction formed by the base area 110 and the first conductive area 32, may be increased, which may minimize the loss of light.

In addition, the back surface of the semiconductor substrate 10 may be formed as a relatively smooth flat surface, which has a lower surface roughness than that of the front surface, via, for example, mirror surface grinding. In the instance where both the first and second conductive areas 32 and 34 are formed on the back surface of the semiconductor substrate 10 as in the present embodiment, the properties of the solar cell 100 may be greatly changed according to the properties of the back surface of the semiconductor substrate 10. Thereby, the back surface of the semiconductor substrate 10 may achieve improved passivation because no protrusion is formed via texturing, whereby the solar cell 100 may achieve improved properties. However, the embodiment of the present invention is not limited thereto. In some instances, the back surface of the semiconductor substrate 10 may be formed with protrusions via texturing, and various other alterations are possible.

The tunneling layer 20 may be formed on the back surface of the semiconductor substrate 10. In one example, the tunneling layer 20 may come into contact with the back surface of the semiconductor substrate 10, which may simplify the configuration and may improve tunneling effects. However, the embodiment of the present invention is not limited thereto.

The tunneling layer 20 serves as a barrier for electrons and holes, thereby preventing the passage of minority carriers and allowing only the passage of majority carriers, which accumulate at a portion adjacent to the tunneling layer 20 and thus have a given level of energy or more. At this time, the majority carriers, having the given level of energy or more, may easily pass through the tunneling layer 20 due to tunneling effects. In addition, the tunneling layer 20 may serve as a diffusion barrier, which prevents the dopant of the conductive areas 32 and 34 from being diffused to the semiconductor substrate 10. The tunneling layer 20 may include various materials to enable the tunneling of the majority carriers therethrough. In one example, the tunneling layer 20 may include an oxide, a nitride, a semiconductor, or a conductive polymer. For example, the tunneling layer 20 may include a silicon oxide, silicon nitride, silicon oxide nitride, intrinsic amorphous silicon, or intrinsic polycrystalline silicon. In particular, the tunneling layer 20 may be configured as a silicon oxide layer including a silicon oxide. This is because the silicon oxide layer has excellent passivation, and thus ensures easy carrier tunneling.

At this time, the tunneling layer 20 may be formed throughout the back surface of the semiconductor substrate 10. As such, the tunneling layer 20 may be easily formed without separate patterning.

In order to achieve sufficient tunneling effects, the tunneling layer 20 may be thinner than the back passivation film 40. In one example, the thickness of the tunneling layer 20 may be 5 nm or less (for example, 2 nm or less, for example, within a range from 0.5 nm to 2 nm). When the thickness T of the tunneling layer 20 exceeds 5 nm, smooth tunneling does not occur, which prevents the solar cell 100 from operating. When the thickness of the tunneling layer 20 is below 0.5 nm, it may be difficult to form a tunneling layer 20 having the desired quality. In order to further improve the tunneling effects, the thickness of the tunneling layer 20 may be 2 nm or less (for example, within a range from 0.5 nm to 2 nm). At this time, the thickness of the tunneling layer 20 may be within a range from 0.5 nm to 1.2 nm in order to further improve the tunneling effects. However, the embodiment of the present invention is not limited thereto, and the thickness of the tunneling layer 20 may have any of various values.

A semiconductor layer 30, which includes the conductive areas 32 and 34, may be disposed on the tunneling layer 20. In one example, the semiconductor layer 30 may be formed so as to come into contact with the tunneling layer 20, which may simplify the semiconductor layer 30 and may maximize the tunneling effects. However, the embodiment of the present invention is not limited thereto.

In the present embodiment, the semiconductor layer 30 may include the first conductive area 32, which includes a first conductive dopant and exhibits a first conductive type, and the second conductive area 34, which includes a second conductive dopant and exhibits a second conductive type. The first conductive area 32 and the second conductive area 34 may be located in the same plane on the tunneling layer 20. That is, there may be no layer disposed between the first conductive area 32 and the tunneling layer 20 and between the second conductive area 34 and the tunneling layer 20. Alternatively, when another layer is interposed between the first and second conductive areas 32 and 34 and the tunneling layer 20, the interposed layer may have the same stacking configuration between the first conductive area 32 and the tunneling layer 20 and between the second conductive area 34 and the tunneling layer 20. In addition, a barrier area 36 may be located between the first conductive area 32 and the second conductive area 34 in the same plane as the conductive areas 32 and 34.

The first conductive area 32 configures an emitter area, which forms a pn junction (or a pn tunnel junction) with the base area 110 with the tunneling layer 20 interposed therebetween, so as to generate carriers via photoelectric conversion.

At this time, the first conductive area 32 may include a semiconductor (e.g. silicon) including the first conductive dopant opposite to that of the base area 110. In the present embodiment, the first conductive area 32 is configured as a semiconductor layer, which is separately formed on the semiconductor substrate 10 (more particularly, on the tunneling layer 20) and which is doped with a first conductive dopant. As such, the first conductive area 32 may be configured as a semiconductor layer having a different crystalline structure from that of the semiconductor substrate 10 so as to be easily formed on the semiconductor substrate 10. For example, the first conductive area 32 may be formed by doping, for example, an amorphous semiconductor, a microcrystalline semiconductor, or a polycrystalline semiconductor (e.g. amorphous silicon, microcrystalline silicon, or polycrystalline silicon), with the first conductive dopant. The first conductive dopant may be included in the semiconductor layer during the formation of the semiconductor layer, or may be included in the semiconductor layer via any of various doping methods, such as thermal diffusion or ion implantation, after the semiconductor layer is formed.

At this time, the first conductive area 32 may include the first conductive dopant, which may exhibit a conductive type opposite to that of the base area 110. That is, when the first conductive dopant is a p-type dopant, a group III element, such as boron (B), aluminum (Al), gallium (ga), or indium (In), may be used. When the first conductive dopant is an n-type dopant, a group V element, such as phosphorus (P), arsenic (As), bismuth (Bi), or antimony (Sb), may be used. In one example, the first conductive dopant may be boron (B), which is a p-type dopant.

The second conductive area 34 is configured as a back field area, which forms a back field to prevent the loss of carriers from the surface of the semiconductor substrate 10 (more accurately, the back surface of the semiconductor substrate 10) due to recombination.

At this time, the second conductive area 34 may include a semiconductor (e.g. silicon), which includes the same second conductive dopant as that of the base area 110. In the present embodiment, the second conductive area 34 is configured as a semiconductor layer, which is separately formed on the semiconductor substrate 10 (more clearly, on the tunneling layer 20) and which is doped with the second conductive dopant. As such, the second conductive area 34 may be configured as a semiconductor layer having a crystalline structure that is different from that of the semiconductor substrate 10 so as to be easily formed on the semiconductor substrate 10. For example, the second conductive area 34 may be formed by doping, for example, an amorphous semiconductor, a microcrystalline semiconductor, or a polycrystalline semiconductor (e.g. amorphous silicon, microcrystalline silicon, or polycrystalline silicon), which may be easily fabricated via various methods such as, for example, deposition, with the second conductive dopant. The second conductive dopant may be included in the semiconductor layer during the formation of the semiconductor layer, or may be included in the semiconductor layer via any of various doping methods, such as thermal diffusion or ion implantation, after the semiconductor layer is formed.

At this time, the second conductive area 34 may include the second conductive dopant, which may exhibit the same conductive type as that of the base area 110. That is, when the first conductive dopant is an n-type dopant, a group V element, such as phosphorus (P), arsenic (As), bismuth (Bi), or antimony (Sb) may be used. When the second conductive dopant is an n-type dopant, a group III element, such as boron (B), aluminum (Al), gallium (ga), or indium (In), may be used. In one example, the second conductive dopant may be phosphorus (P), which is an n-type dopant.

In addition, the barrier area 36 is located between the first conductive area 32 and the second conductive area 34 so as to cause the first conductive area 32 and the second conductive area 34 to be spaced apart from each other. When the first conductive area 32 and the second conductive area 34 come into contact with each other, shunts occur, undesirably causing deterioration in the performance of the solar cell 100. However, in the present embodiment, it is possible to prevent unnecessary shunts by positioning the barrier area 36 between the first conductive area 32 and the second conductive area 34.

The barrier area 36 may include any of various materials, which may be located between the first conductive area 32 and the second conductive area 34 so as to substantially insulate the conductive areas 32 and 34 from each other. That is, the barrier area 36 may be formed of an undoped insulation material (e.g. an oxide or a nitride). Alternatively, the barrier area 36 may include an intrinsic semiconductor. At this time, the first conductive area 32, the second conductive area 34 and the barrier area 36 may be formed of the same semiconductor (e.g. amorphous silicon, microcrystalline silicon or polycrystalline silicon), which is continuously formed such that side surfaces of the three 32, 34 and 36 come into contact with one another. The barrier area 36 may include an i-type (intrinsic) semiconductor material, which substantially includes no dopant. In one example, after a semiconductor layer including a semiconductor material is formed, a portion of the semiconductor layer is doped with the first conductive dopant so as to form the first conductive area 32 and another portion of the semiconductor layer is doped with the second conductive dopant so as to form the second conductive area 34, whereby the remaining area on which the first conductive area 32 and the second conductive area 34 are not formed may configure the barrier area 36. In this way, the method of manufacturing the first conductive area 32, the second conductive area 34, and the barrier area 36 may be simplified.

However, the embodiment of the present invention is not limited thereto. Thus, when the barrier area 36 is formed separately from the first conductive area 32 and the second conductive area 34, the thickness of the barrier area 36 may differ from those of the first conductive area 32 and the second conductive area 34. In one example, in order to more effectively prevent shunts between the first conductive area 32 and the second conductive area 34, the barrier area 36 may be thicker than the first conductive area 32 and the second conductive area 34. Alternatively, in order to reduce the amount of raw materials required to form the barrier area 36, the barrier area 36 may be thinner than the first conductive area 32 and the second conductive area 34. Of course, various other alterations are possible. In addition, the basic constituent material of the barrier area 36 may differ from those of the first conductive area 32 and the second conductive area 34.

In addition, the present embodiment illustrates the configuration in which the barrier area 36 causes the first conductive area 32 and the second conductive area 34 to be wholly spaced apart from each other. However, the embodiment of the present invention is not limited thereto. Accordingly, the barrier area 36 may be formed to cause the first conductive area 32 and the second conductive area 34 to be spaced apart from each other only along a portion of the boundary therebetween. Thereby, the conductive areas 32 and 34 may come into contact with each other along the remaining portion of the boundary between the first conductive area 32 and the second conductive area 34.

Here, the first conductive area 32, which is of a different conductive type from that of the base area 110, may be wider than the second conductive area 34, which is of the same conductive type as that of the base area 110. As such, the pn junction formed through the tunneling layer 20 between the base area 110 and the first conductive area 32 may be formed to be wider. At this time, when the base area 110 and the second conductive area 34 are of an n-type conductive type and the first conductive area 32 is of a p-type conductive type, the wide first conductive area 32 may effectively collect holes, which move relatively slowly. The plan configuration of the first conductive area 32, the second conductive area 34 and the barrier area 36 will be described below in more detail with reference to FIG. 2.

The back passivation film 40 may be formed on the first and second conductive areas 32 and 34 and the barrier area 36 at the back surface of the semiconductor substrate 10. In one example, the back passivation film 40 may be formed so as to come into contact with the first and second conductive areas 32 and 34 and the barrier area 36, thus having a simplified configuration. However, the embodiment of the present invention is not limited thereto.

The back passivation film 40 has the contact hole 46 for electrically connecting the conductive areas 32 and 34 and the electrodes 42 and 44 to each other. The contact hole 46 includes a first contact hole 461 for connecting the first conductive area 32 and the first electrode 42 to each other, and a second contact hole 462 for connecting the second conductive area 34 and the second electrode 44 to each other. As such, the back passivation film 40 serves to prevent the first conductive area 32 and the second conductive area 34 from being connected to the incorrect electrode (e.g., the second electrode 44 in the instance of the first conductive area 32 and the first electrode 42 in the instance of the second conductive area 34). In addition, the back passivation film 40 may have the passivation effects of the first and second conductive areas 32 and 34 and/or the barrier area 36.

The back passivation film 40 may be disposed on a portion of the semiconductor layer 30 on which the electrodes 42 and 44 are not located. The back passivation film 40 may be thicker than the tunneling layer 20. As such, the insulation and passivation properties of the back passivation film 40 may be improved. Various other alterations are possible.

In one example, in the present embodiment, at least one of the front passivation film 24 and the anti-reflection film 26, and the back passivation film 40 may include no dopant in order to achieve, for example, excellent insulation and passivation.

In the present embodiment, the back passivation film 40 may include a first layer 40a disposed on (e.g. in contact with) the conductive areas 32 and 34 and the barrier area 36 (or the semiconductor layer 30) and a second layer 40b disposed on the first layer 40a, the second layer 40b including a different material from that of the first layer 40a. In addition, the contact hole 46 may include a first contact hole region 46a formed in the first layer 40a and a second contact hole region 46b formed in the second layer 40b at a position corresponding to the first contact hole region 46a so as to communicate with the first contact hole region 46a. In the present embodiment, because the first contact hole region 46a and the second contact hole region 46b are formed in the first layer 40a and the second layer 40b, which are formed of different materials and are formed via different processes, the first and second contact hole regions 46a and 46b may have, for example, different sizes and shapes. This will be described below in more detail.

Here, the second contact hole region 46b may be formed by laser etching, and the first contact hole region 46a may be formed by wet etching. As such, the first contact hole region 46a formed in the first layer 40a may be larger than the second contact hole region 46b formed in the second layer 40b. This is because an under-cut is formed by isotropic etching during wet etching. This will be described below in more detail. The size of the first contact hole region 46a may be greater at a region adjacent to the second layer 40b than at a region adjacent to the conductive area 30. For example, the size of the first contact hole region 46a may gradually increase with decreasing distance to a region thereof adjacent to the second layer 40b compared to a region thereof adjacent to the conductive area 30, and the first contact hole region 46a may be defined by a curved side surface, and the first layer 40a may be defined by a con-cavely curved side surface. As such, the side surface of the first contact hole region 46a and the side surface of the second contact hole region 46b may be stepped. That is, the side surface of the second layer 40b may protrude inward of the contact hole 46 more than the side surface of the first layer 40a, and the side surface of the second layer 40b may be more concave or retracted than the side surface of the second layer 40b. With this stepped shape, an empty space V may be present between the electrodes 42 and 44 and the protective film 41 disposed on (e.g. in contact with) the side surface of the second layer 40b. This will be described below in more detail.

In one example, the inner side surface of the second contact hole region 46b may have an inclined flat surface which is oriented at or close to a right angle relative to the upper surface or the lower surface of the conductive areas 32 and 34. However, the embodiment of the present invention is not limited thereto.

At this time, the first layer 40a, which is disposed on (e.g. in contact with) the conductive areas 32 and 34 and the barrier area 36 so as to be interposed between the conductive areas 32 and 34 and the barrier area 36 and the second layer 40b, serves to prevent damage to the conductive areas 32 and 34, which might otherwise occur when the second contact hole region 46b is formed in the second layer 40b. In the instance where the first layer 40a is not present unlike the present embodiment, the second contact hole region 46b is formed to penetrate the second layer 40b by removing a portion of the second layer 40b via, for example, etching, whereby a portion of the conductive areas 32 and 34 disposed below the second layer 40b may be removed, or the properties of the conductive areas 32 and 34 may be deteriorated. When damage to the conductive areas 32 and 34 occurs, the properties and the efficiency of the solar cell 100 are deteriorated. Accordingly, in the present embodiment, the first layer 40a, which has not been removed upon removal of the second layer 40b, is disposed on the conductive areas 32 and 34 so that, for example, the material or object used to remove the second layer 40b comes into contact with the first layer 40a, but does not come into contact with the conductive areas 32 and 34. This may completely prevent damage to the conductive areas 32 and 34.

Upon the formation of the contact hole 46, the second layer 40b must be removed, but the first layer 40a must remain, rather than being removed. To this end, various methods may be used. In one example, when laser etching is used to form the contact hole 46, the first layer 40a and the second layer 40b may have different band gaps. That is, the band gap of the first layer 40a may be greater than those of the conductive areas 32 and 34 and the second layer 40b, and the band gap of the laser used for laser etching may have a value that falls between the band gap of the second layer 40b and the band gap of the first layer 40a. The band gap of a laser is associated with the wavelength of the laser, and therefore may have a value converted from the wavelength of the laser. Thereby, the second layer 40b, which has a smaller band gap than the band gap of the laser, is melted and removed by the laser, and the first layer 40a, which has a greater band gap than the band gap of the laser, transmits the laser and remains unchanged. Accordingly, upon laser etching, the contact hole 46 may be formed in the second layer 40b and the first layer 40a may remain unchanged or may attain only laser etching marks.

For reference, in the instance where the conductive areas 32 and 34 include a polycrystalline semiconductor layer, the band gap of the conductive areas 32 and 34 is about 1.12 eV, which is equal to or smaller than the band gap of the second layer 40b. Thus, in the instance where the first layer 40a is not provided, a portion of the conductive areas 32 and 34 may be etched upon etching of the second layer 40b, which may cause damage to the conductive areas 32 and 34. On the other hand, in the present embodiment, the first layer 40a, which has a greater band gap than that of the conductive areas 32 and 34, is formed to prevent the conductive areas 32 and 34 from being etched upon etching of the second layer 40b.

For example, the band gap of the first layer 40a may be 3 eV or more, and the band gap of the second layer 40b may be below 3 eV. For example, the band gap of the first layer 40a may be 5 eV or more (e.g. within a range from 5 eV to 10 eV), and the band gap of the second layer 40b may be 0.5 eV or more but below 3 eV. These values are determined in consideration of the wavelength of the laser used for laser etching, and may be changed when the wavelength of the laser is changed. The use of the laser for laser etching will be described below in more detail with regard to the manufacturing method. However, the embodiment of the present invention is not limited thereto.

Various methods may be used to adjust the band gap. In the present embodiment, in consideration of the fact that different materials have different band gaps, the first layer 40a and the second layer 40b may be formed of different materials. For example, the first layer 40a may include an oxide (e.g. a silicon oxide, an aluminum oxide, or a titanium oxide) or amorphous silicon having a relatively high band gap. Because the oxide has a high band gap of 5 eV or more (generally, within a range from 8 eV to 9 eV), the oxide may remain even after, for example, laser etching is performed. In addition, the amorphous silicon may have a band gap of 3 eV or more and may remain even after, for example, laser etching is performed. The first layer 40a may be a single layer or multiple layers having the form of a combination of two or more layers.

The second layer 40b may include a nitride or a carbide (e.g. silicon nitride or silicon carbide) having a relatively low band gap. The band gap of the silicon nitride or the silicon carbide is generally below 3 eV (e.g. within a range from 0.5 eV to 3 eV), although it may differ slightly depending on the composition of the silicon nitride or the silicon carbide. The second layer 40b may be a single layer or multiple layers having the form of a combination of two or more layers.

The thickness of the first layer 40a may be set such that the first layer 40a is protected from etching or damage when the second contact hole region 46b is formed. As such, the first layer 40a may be thicker than the tunneling layer 20 and the protective film 41. A thickness that protects the first layer 40a from etching or damage when the second contact hole region 46b is formed is sufficient, but on the other hand an excessive thickness causes problems such as, for example, increased processing time. In consideration of this, the first layer 40a may be thinner than the conductive areas 32 and 34, and may be as thick as or thinner than the second layer 40b. Here, the first layer 40a may be thinner than the second layer 40b.

In one example, the thickness of the first layer 40a may be within a range from 5 nm to 100 nm. When the thickness of the first layer 40a is below 5 nm, it may be difficult to effectively protect the conductive areas 32 and 34 when the second contact hole region 46b is formed. When the thickness of the first layer 40a exceeds 100 nm, manufacturing processing time is increased, causing a deterioration in productivity. In order to both effectively protect the conductive areas 32 and 34 and reduce the processing time, the thickness of the first layer 40a may be within a range from 10 nm to 50 nm (e.g. within a range from 10 nm to 30 nm). However, the embodiment of the present invention is not limited thereto, and the first layer 40a may have various thicknesses.

The first contact hole region 46a formed in the first layer 40a may be formed via a process, which is different from the process of forming the second contact hole region 46b, after the second contact hole region 46b is formed. As described above, the first layer 40a has at least a given thickness in order to prevent damage to the conductive areas 32 and 34 in the process of forming the second contact hole region 46b. Thus, when the conductive areas 32 and 34 and the electrodes 42 and 44 are electrically connected to each other in the state in which the first layer 40a remains unchanged under the second contact hole region 46b, the electrical connection between the conductive areas 32 and 34 and the electrodes 42 and 44 may be deteriorated due to the thickness of the first layer 40a. In consideration of this, in the present embodiment, the first contact hole region 46a is formed at the position on the first layer 40a at which the second contact hole region 45b is located. The process of forming the first contact hole region 46a may be different from the process of forming the second contact hole region 46b in order to minimize, for example, damage to the conductive areas 32 and 34 and deterioration of the properties thereof. This will be described below in more detail.

In this way, the contact hole 46, which includes the first contact hole region 46a and the second contact hole region 46b, is formed through the back passivation film 40.

The protective film 41 is located between the conductive areas 32 and 34 and the electrodes 42 and 44 within the contact hole 46 in the back passivation film 40. Because the contact hole 46 is formed through the back passivation film 40, the back passivation film 40 is not present at the location of the contact hole 46, which may result in deterioration in passivation when the protective film 41 is not provided. To prevent this problem, in the present embodiment, the protective film 41 is located above the conductive areas 32 and 34 within the contact hole 46. In this way, it is possible to effectively prevent deterioration in passivation, which may be caused by the presence of the contact hole 46.

In addition, the protective film 41 may prevent the conductive areas 32 and 34 from being damaged in various processes which may be performed after the contact hole 46 is formed. For example, when the electrodes 42 and 44 are formed via, for example, sputtering within the contact hole 46, the surface exposed through the contact hole 46 is exposed to plasma. At this time, when the protective film 41 is not provided unlike the present embodiment, the conductive areas 32 and 34 may be directly exposed to plasma, thus entailing the risk of surface damage. On the other hand, when the protective film 41 is provided as in the present embodiment, the protective film 41 may prevent the conductive areas 32 and 34 from being exposed to plasma, or may prevent the generation of plasma. In addition, the protective film 41 serves to implement the passivation of the surface of the conductive areas 32 and 34, resulting in improved passivation.

The protective film 41 may be formed after the contact hole 46, which includes the first and second contact hole regions 46a and 46b, is formed, thereby being patterned upon patterning of the electrodes 42 and 44. Thereby, the protective film 41 may be formed over the entire portion on which the electrodes 42 and 44 are formed between the electrodes 42 and 44 and the back passivation film 40.

For example, the protective film 41 may include a portion which is disposed on (e.g. in contact with) the bottom surface of the contact hole 46 (e.g., the surface of the conductive areas 32 and 34 exposed through the contact hole 46), a portion which is disposed on (e.g. in contact with) the side surface of the contact hole 46 (e.g., the side surfaces of the first and second layers 40a and 40b), and a portion which is disposed on (e.g. in contact with) the outer surface of the back passivation film 40 or the wide surface (the lower surface in FIG. 1) between the back passivation film 40 and the surface of the electrodes 42 and 44 facing the back passivation film 40. The portions of the protective film 41 described above may be integrated with one another, thereby being configured as the same layer, which is continuously formed. At this time, the side surfaces of the electrodes 42 and 44 and the side surface of the protective film 41 may be formed in the same plane. This serves to allow the protective film 41 to be etched simultaneously with patterning for formation of the electrodes 42 and 44.

At this time, because the conductive areas 32 and 34 and the electrodes 42 and 44 are electrically connected to each other with the protective film 41 interposed therebetween, the protective film 41 may be thin in order to improve the electrical connection between the conductive areas 32 and 34 and the electrodes 42 and 44. That is, the protective film 41 may be thinner than the back passivation film 40 (for example, each of the first layer 40a and the second layer 40b).

The protective film 41 is thinner than the back passivation film 40, and for example, is thinner than each of the first layer 40a and the second layer 40b. This is because the back passivation film 40 must be relatively thick for sufficient passivation, whereas the protective film 41 needs only a small thickness to protect the conductive areas 32 and 34 without deterioration in electrical connectivity.

In one example, the protective film 41 may be thinner than the tunneling layer 20. As such, even if the protective film 41 is present, the electrical connection between the conductive areas 32 and 34 and the electrodes 42 and 44 may be excellent. However, the embodiment of the present invention is not limited thereto, and the thickness of the protective film 41 may be equal to or greater than the thickness of the tunneling layer 20.

For example, the thickness of the protective film 41 may be within a range from 0.5 nm to 2 nm (e.g. within a range from 0.5 nm to 1.2 nm). When the thickness of the protective film 41 is below 0.5 nm, it may be difficult to form the entire protective film 41 at an even thickness (or consistent thickness) and the effects acquired by the protective film 41 may be insufficient. When the thickness of the protective film 41 exceeds 2 nm, the electrical connection between the conductive areas 32 and 34 and the electrodes 42 and 44 may be slightly deteriorated. When the thickness of the protective film 41 is 1.2 nm or less, the electrical connection may be further improved. However, the embodiment of the present invention is not limited thereto, and various alterations are possible.

The protective film 41 may be easily formed via a simplified process, and may be formed of a material which may improve passivation and may protect the conductive areas 32 and 34. At this time, the protective film 41 may be formed of a material, which is different from that of a portion constituting the back passivation film 40. In the present embodiment, the protective film 41 may be formed of a material, which is different from a material constituting the second layer 40a.

In one example, the protective film 41 may be formed of an oxide. In particular, the protective film 41 may be formed of a silicon oxide, which is acquired via a combination of oxygen and a semiconductor material (e.g. silicon) included in the conductive areas 32 and 34. When the protective film 41 includes an oxide (in particular, a silicon oxide), the protective film 41 may exhibit excellent passivation characteristics, and may be easily formed via, for example, a chemical oxidation process or a thermal oxidation process. This will be described below in more detail with regard to the manufacturing method.

The electrodes 42 and 44, arranged on the back surface of the semiconductor substrate 10, include the first electrode 42 electrically and physically connected to the first conductive area 32 and the second electrode 44 electrically and physically connected to the second conductive area 34.

At this time, the first electrode 42 is formed to fill at least a portion of the contact hole 46 in the back passivation film 40, thereby being connected to the first conductive area 32 with the protective film 41 interposed therebetween. The second electrode 44 is formed to fill at least a portion of the contact hole 46 in the back passivation film 40, thereby being connected to the second conductive area 34. As described above, a stepped portion due to the under-cut of the first layer 40a is located between the side surfaces of the first layer 40a and the second layer 40b of the back passivation film 40 (e.g., the inner side surface of the contact hole 46), and the protective film 41, formed by, for example, a chemical oxidation process, comes into close contact with the side surfaces of the first layer 40a and the second layer 40b. That is, the protective film 41 is formed such that the stepped or indented portion located at the side surfaces of the first layer 40a and the second layer 40b remains. However, the electrodes 42 and 44 may be not completely formed at the stepped portion formed with the under-cut (e.g., the concave portion of the side surface of the first layer 40a). Thus, the empty space V may remain unchanged between the first layer 40a and the protective film 41 and the electrodes 42 and 44, which are formed to come into close contact with the first layer 40a. The empty space V does not cause any problem with regard to properties, and moreover, based on the presence of the empty space V, it can be checked that the first layer 40a formed via wet etching has the under-cut. However, the embodiment of the present invention is not limited thereto. Thus, no empty space V may be formed in the side surface of the contact hole 46 between the protective film 41 and the electrodes 42 and 44, and the electrodes 42 and 44 may come into close contact with the protective film 41 on the side surface of the contact hole 44. This will be described later in detail with reference to FIG. 5.

At this time, in one example, the protective film 41 may be formed by chemical oxidation. In addition, because the conductive areas 32 and 34 and the first layer 40a and the second layer 40b of the back passivation film 40 include silicon, the protective film 41 including a silicon oxide may be formed via chemical oxidation on all of the conductive areas 32 and 34, the side surfaces of the first layer 40a and the second layer 40b, and the second layer 40b. At this time, because the proportion of silicon constituting the first and second layers 40a and 40b is smaller than the proportion of silicon constituting the conductive areas 32 and 34, the protective film 41 formed on the conductive areas 32 and 34 may be thicker than the protective film 41 formed on the side surface of the first layer 40a, the side surface of the second layer 40b, and the outer surface of the second layer 40b. However, the embodiment of the present invention is not limited thereto, and the thickness of the protective film 41 may be consistent. In addition, in the instance where the protective film 41 is formed via chemical oxidation, the protective film 41 need not be formed on the first layer 40a and/or the second layer 40b of the back passivation film 40 when the first layer 40a and/or the second layer 40b do not include silicon. Because the protective film 41 may be formed via various methods other than chemical oxidation, the protective film 41 may be formed in an even thickness throughout the first layer 40a and/or the second layer 40b even if the first and second layers 40a and 40b do not include silicon. Various other alterations are possible.

The first and second electrodes 42 and 44 may include various metal materials. In addition, the first and second electrodes 42 and 44 may have various plan shapes required in order to be connected respectively to the first conductive area 32 and the second conductive area 34 without being electrically connected to each other so as to collect carriers and transmit the same to the outside. That is, the embodiment of the present invention is not limited as to the plan shape of the first and second electrodes 42 and 44.

Hereinafter, one example of the plan shapes of the first conductive area 32, the second conductive area 34, the barrier area 36, and the first and second electrodes 42 and 44 will be described in detail with reference to FIGS. 1 and 2.

Referring to FIGS. 1 and 2, in the present embodiment, the first conductive area 32 and the second conductive area 34 are elongated to form stripes and are alternately arranged in the direction crossing the longitudinal direction. The barrier area 36 may be located, as a spacer, between the first conductive area 32 and the second conductive area 34. Although not illustrated in FIG. 2, a plurality of first conductive areas 32, which are spaced apart from one another, may be connected to one another at one edge thereof, and a plurality of second conductive areas 34, which are spaced apart from one another, may be connected to one another at the other edge thereof. However, the embodiment of the present invention is not limited thereto.

At this time, the first conductive area 32 may be wider than the second conductive area 34. In one example, the area of the first conductive area 32 and the second conductive area 34 may be adjusted by providing the first and second conductive areas 32 and 34 with different widths. That is, the width W1 of the first conductive area 32 may be greater than the width W2 of the second conductive area 34.

In addition, the first electrode 42 may have a stripe shape so as to correspond to the first conductive area 32, and the second electrode 44 may have a stripe shape so as to correspond to the second conductive area 34. Of course, the contact hole 46 may be formed to connect only a portion of the first and second electrodes 42 and 44 to the first conductive area 32 and the second conductive area 34 respectively. For example, a plurality of contact holes 46 may be formed. Alternatively, each contact hole (see reference numeral 46 in FIG. 1) may be formed along the entire length of the first and second electrodes 42 and 44 so as to correspond to the first and second electrodes 42 and 44. As such, it is possible to maximize the contact area between the first and second electrodes 42 and 44 and the first and second conductive areas 32 and 34 so as to improve the collection efficiency of carriers. Various other alterations are possible. In addition, although not illustrated in FIG. 2, a plurality of first electrodes 42 may be connected to one another at one edge thereof, and a plurality of second electrodes 44 may be connected to one another at the other edge thereof. However, the embodiment of the present invention is not limited thereto.

Referring again to FIG. 1, the front passivation film 24 and/or the anti-reflection film 26 may be disposed on the front surface of the semiconductor substrate 10 (more accurately, on the front field area 130 formed on the front surface of the semiconductor substrate 10). In some embodiments, only the front passivation film 24 may be formed on the semiconductor substrate 10, only the anti-reflection film 26 may be formed on the semiconductor substrate 10, or the front passivation film 24 and the anti-reflection film 26 may be disposed in sequence on the semiconductor substrate 10. FIG. 1 illustrates that the front passivation film 24 and the anti-reflection film 26 are formed in sequence on the semiconductor substrate 10 such that the semiconductor substrate 10 comes into contact with the front passivation film 24. However, the embodiment of the present invention is not limited thereto and the semiconductor substrate 10 may come into contact with the anti-reflection film 26. Various other alterations are possible.

The front passivation film 24 and the anti-reflection film 26 may be formed substantially throughout the front surface of the semiconductor substrate 10. Here, the expression "the film formed throughout the substrate" includes the instance where the film is physically completely formed on the entire substrate and the instance where the film is inevitably formed on all except for a small portion of the substrate.

The front passivation film 24 comes into contact with the front surface of the semiconductor substrate 10 for passivation of defects present on the front surface or on the bulk of the semiconductor substrate 10. As such, it is possible to increase the opening voltage of the solar cell 100 by removing recombination sites of minority carriers. The anti-reflection film 26 reduces the reflectance of light introduced into the front surface of the semiconductor substrate 10. This may increase the quantity of light reaching the pn junction formed at the interface of the base area 110 and the first conductive area 32. As a result, the short-circuit current Isc of the solar cell 100 may be increased. In conclusion, the front passivation film 24 and the anti-reflection film 26 may increase the opening voltage and the short-circuit current of the solar cell 100, thereby improving the efficiency of the solar cell 100.

The front passivation film 24 and/or the anti-reflection film 26 may be formed of various materials. In one example, the front passivation film 24 and/or the anti-reflection film 26 may be a single-layered film or a multi-layered film having the form of a combination of two or more layers selected from among the group of a silicon nitride layer, a silicon nitride layer containing hydrogen, a silicon oxide layer, a silicon oxide nitride layer, an aluminum oxide layer, a silicon carbide layer, $MgF_2$, $ZnS$, $TiO_2$ and $CeO_2$. In one example, the front passivation film 24 may be a silicon oxide film formed on the semiconductor substrate 10, and the anti-reflection film 26 may take the form of a stack in which a silicon nitride layer and a silicon carbide layer are stacked one above another in sequence.

When light is introduced into the solar cell 100 in accordance with the present embodiment, holes and electrons are generated via photoelectric conversion at the pn junction formed between the base area 110 and the first conductive area 32, and the generated holes and electrons move to the first conductive area 32 and the second conductive area 34 via tunneling through the tunneling layer 20, and thereafter move to the first and second electrodes 42 and 44. This results in the generation of electrical energy.

In the back contact type solar cell 100 in accordance with the present embodiment in which the electrodes 42 and 44 are formed on the back surface of the semiconductor substrate 10 and no electrodes are formed on the front surface of the semiconductor substrate 10, it is possible to minimize shading loss at the front surface of the semiconductor substrate 10. This may improve the efficiency of the solar cell 100. However, the embodiment of the present invention is not limited thereto.

In addition, because the first and second conductive areas 32 and 34 are formed on the semiconductor substrate 10 with the tunneling layer 20 interposed therebetween, the first and second conductive areas 32 and 34 are configured as layers that are separate from the semiconductor substrate 10. In this way, it is possible to minimize the loss of light due to recombination compared to the instance where a doping area, formed by doping the semiconductor substrate 10 with a dopant, is used as a conductive area.

In addition, the protective film 41 is formed inside the contact hole 46 in the back passivation film 40, and the conductive areas 32 and 34 and the electrodes 42 and 44 are connected to each other with the protective film 46 interposed therebetween so as to improve passivation inside the contact hole 46 and to protect the conductive areas 32 and 34. In addition, the protective film 41 may be formed as a separate layer in a process separate from the process of forming the back passivation film 40, so as to be thinner than the back passivation film 40. As such, excellent electrical connection between the conductive areas 32 and 34 and the electrode 42 and 44 may be maintained. At this time, because the back passivation film 40 includes the first layer 40a and the second layer 40b, which are formed of different materials, and the first contact hole region 46a and the second contact hole region 46b are formed respectively in the first layer 40a and the second layer 40b via different processes, it is possible to effectively prevent damage to the conductive areas 32 and 34 during the formation of the contact hole 46. In this way, the efficiency of the solar cell 100 may be improved.

Figure 3A:
FIGS. 3A to 3N are sectional views illustrating a method of manufacturing a solar cell in accordance with an embodiment of the present invention.

A method of manufacturing the solar cell 100 having the above-described configuration will be described below in detail with reference to FIGS. 3A to 3N. FIGS. 3A to 3N are sectional views illustrating a method of manufacturing a solar cell in accordance with an embodiment of the present invention.

First, as illustrated in FIG. 3A by example, the semiconductor substrate 10, which includes the base area 110 containing a second conductive dopant, is prepared. In the present embodiment, the semiconductor substrate 10 may be configured as a silicon substrate (e.g., a silicon wafer) having an n-type dopant. The n-type dopant may be selected from group V elements such as, for example, phosphorous (P), arsenic (As), bismuth (Bi), and antimony (Sb). However, the embodiment of the present invention is not limited thereto, and the base area 110 may have a p-type dopant.

Figure 3B:

Subsequently, as illustrated in FIG. 3B by example, the tunneling layer 20 is formed on the back surface of the semiconductor substrate 10. The tunneling layer 20 may be formed on the entire back surface of the semiconductor substrate 10.

Here, the tunneling layer 20 may be formed via, for example, thermal growth or deposition (e.g. Plasma Enhanced Chemical Vapor Deposition (PECVD) or Atomic Layer Deposition (ALD)). However, the embodiment of the present invention is not limited thereto, and the tunneling layer 20 may be formed via any of various other methods.

Figure 3C:
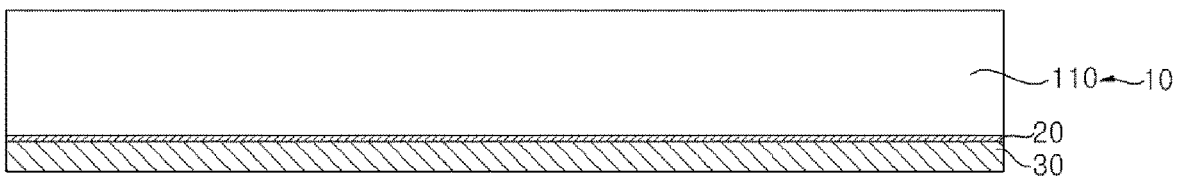
Figure 3D:
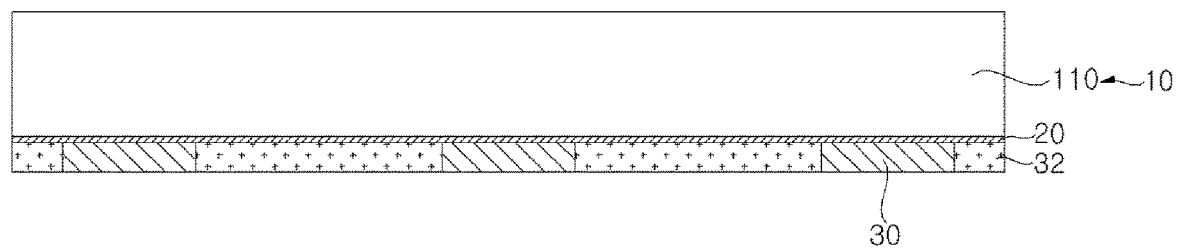
Figure 3E:
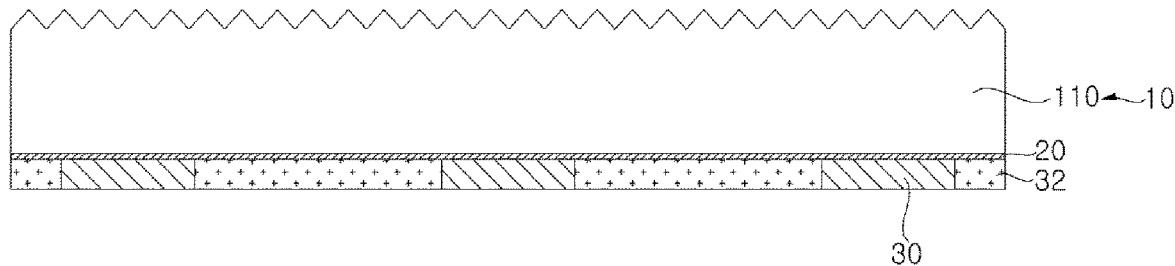
Figure 3F:
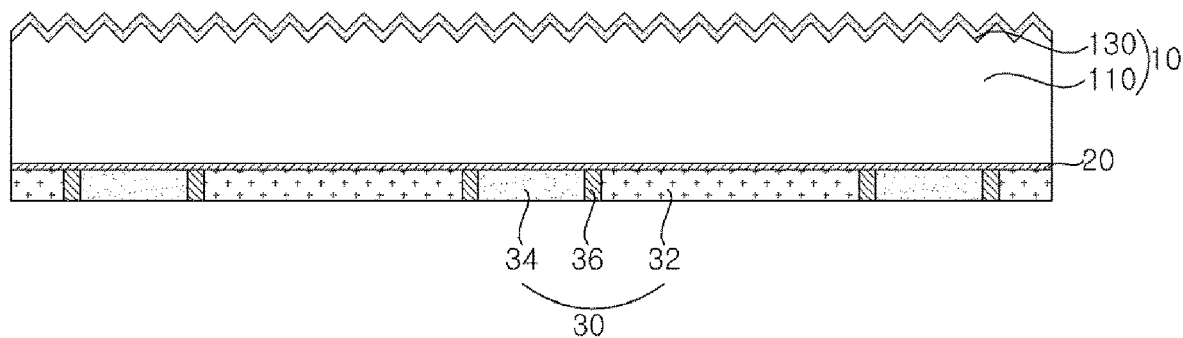

Subsequently, as illustrated in FIGS. 3C and 3F by example, the first conductive area 32 and the second conductive area 34 are formed on the tunneling layer 20, and the front field area 130 is formed. Then, a texture may be formed on the front surface of the semiconductor substrate 10. This will be described in detail as follows.

As illustrated in FIG. 3C by example, the semiconductor layer 30 is formed on the tunneling layer 20. The semiconductor layer 30 may be formed of a microcrystalline, amorphous, or polycrystalline semiconductor. The semiconductor layer 30 may be formed via, for example, thermal growth or deposition (e.g. PECVD). However, the embodiment of the present invention is not limited thereto, and the semiconductor layer 30 may be formed via any of various methods.

Subsequently, as illustrated in FIG. 3D by example, the first conductive area 32 is formed in the semiconductor layer 30. For example, the first conductive area 32 may be formed by doping an area of the semiconductor layer 30, corresponding to the first conductive area 32, with a first conductive dopant via any of various methods, such as ion implantation, thermal diffusion, or laser doping.

Subsequently, as illustrated in FIG. 3E by example, the front surface of the semiconductor substrate 10 may be subjected to texturing, so as to have protrusions. The texturing performed on the surface of the semiconductor substrate 10 may be wet or dry texturing. Wet texturing may be performed by dipping the semiconductor substrate 10 into a texturing solution, and has the advantage of a short processing time. Dry texturing is the process of grinding the surface of the semiconductor substrate 10 using, for example, a diamond grill or laser, and may entail the disadvantages of a long processing time and the potential for damage to the semiconductor substrate 10, although it may be advantageous in that the protrusions are formed evenly. In addition, the texturing on the semiconductor substrate 10 may be, for example, Reactive Ion Etching (RIE). As such, in the embodiment of the present invention, the semiconductor substrate 10 may be subjected to texturing via various methods.

The present embodiment illustrates that the front surface of the semiconductor substrate 10 is subjected to texturing after the semiconductor layer 30 is formed. However, the embodiment of the present invention is not limited thereto. Accordingly, the surface of the semiconductor substrate 10 may be subjected to texturing before the semiconductor layer 30 is formed, or in another process.

Subsequently, as illustrated in FIG. 3F by example, the second conductive area 34 and the barrier area 36 are formed in the semiconductor layer 30, and the front field area 130 is formed on the front surface of the semiconductor substrate 10.

For example, the second conductive area 34 may be formed by doping an area of the semiconductor layer 30, corresponding to the second conductive area 34, with a second conductive dopant via any of various methods, such as ion implantation, thermal diffusion, or laser doping. As such, the area located between the first conductive area 32 and the second conductive area 34 constitutes the barrier area 36. In addition, the front field area 130 may be formed by doping the front surface of the semiconductor substrate 10 with a second conductive dopant via any of various methods, such as ion implantation, thermal diffusion, or laser doping. For example, the second conductive area 34 and the front field area 130 may be simultaneously formed via thermal diffusion, which may simplify the manufacturing process.

However, the embodiment of the present invention is not limited thereto, and various alterations are possible as to the method or sequence of forming the conductive areas 32 and 34, the barrier area 36, and the front field area 130. In addition, the barrier area 36 need not be formed.

Figure 3G:
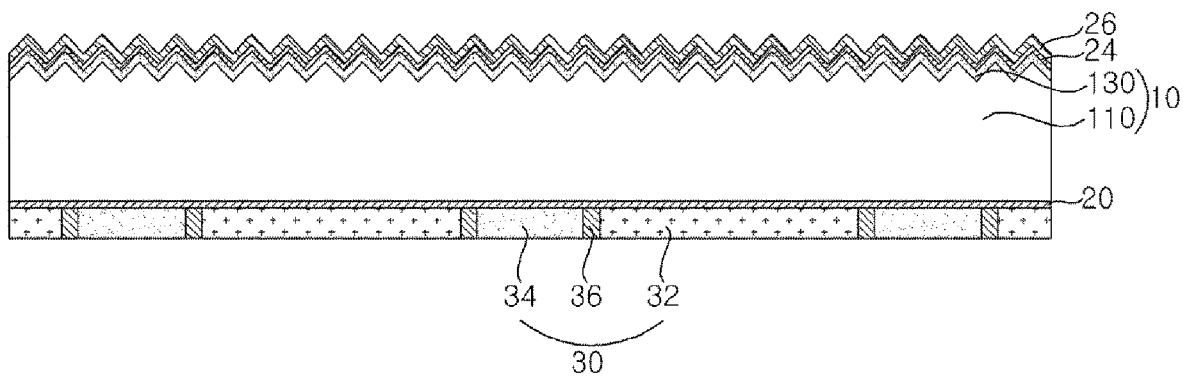

Subsequently, as illustrated in FIG. 3G by example, the passivation film 24 and the anti-reflection film 26 are formed in sequence on the front surface of the semiconductor substrate 10. That is, the passivation film 24 and the anti-reflection film 26 are formed over the entire front surface of the semiconductor substrate 10. The passivation film 24 and the anti-reflection film 26 may be formed via any of various methods such as, for example, vacuum deposition, chemical vapor deposition, spin coating, screen printing, or spray coating.

Figure 3H:
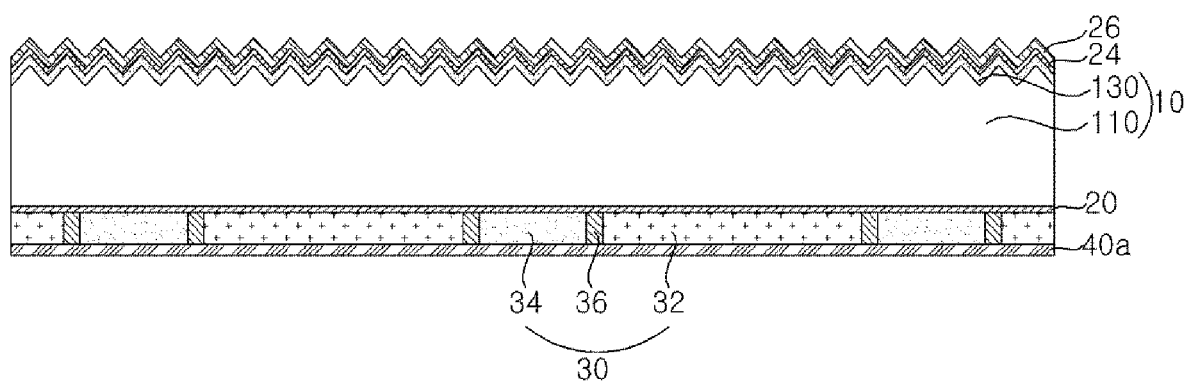
Figure 3I:
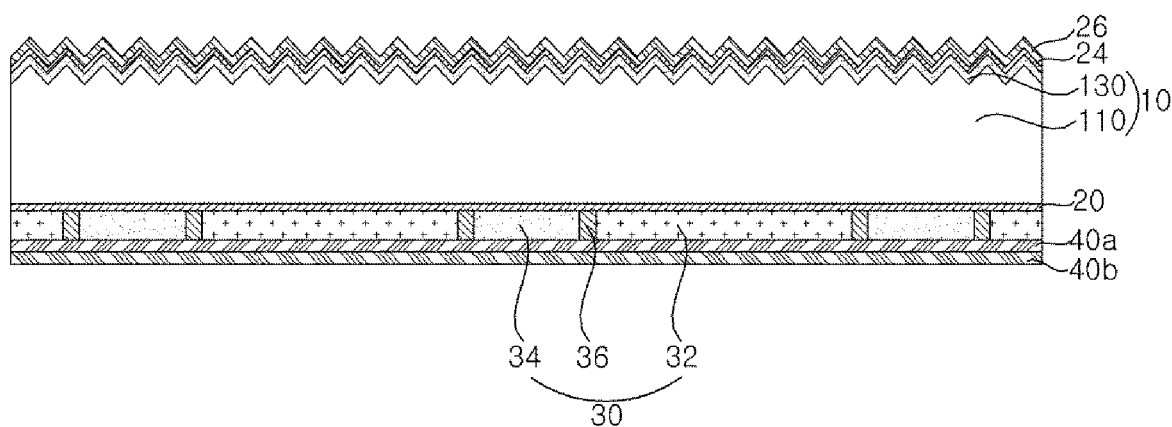

Subsequently, the first layer 40a is formed over the entire back surface of the semiconductor substrate 10 as illustrated in FIG. 3H by example, and the second layer 40b is formed over the entire first layer 40a as illustrated in FIG. 3I by example. That is, the back passivation film 40, which includes the first layer 40a and the second layer 40b, is formed over the back surface of the semiconductor substrate 10 so as to cover the first and second conductive areas 32 and 34.

The back passivation film 40, which includes the first layer 40a and the second layer 40b, may be formed via any of various methods such as, for example, vacuum deposition, chemical vapor deposition, spin coating, screen printing, or spray coating. In one example, the first layer 40a and the second layer 40b may be formed via PECVD, and may be formed via successive processes in the same plasma enhanced chemical vapor deposition equipment.

FIGS. 3A to 3N and the description thereof illustrate that the first layer 40a and the second layer 40b of the back passivation film 40 are formed after the front passivation film 24 and the anti-reflection film 26 are formed. However, the embodiment of the present invention is not limited thereto, and the sequence of forming the front passivation film 24, the anti-reflection film 26, and the first layer 40a and the second layer 40b of the back passivation film 40 may be altered in various ways.

Figure 3J:
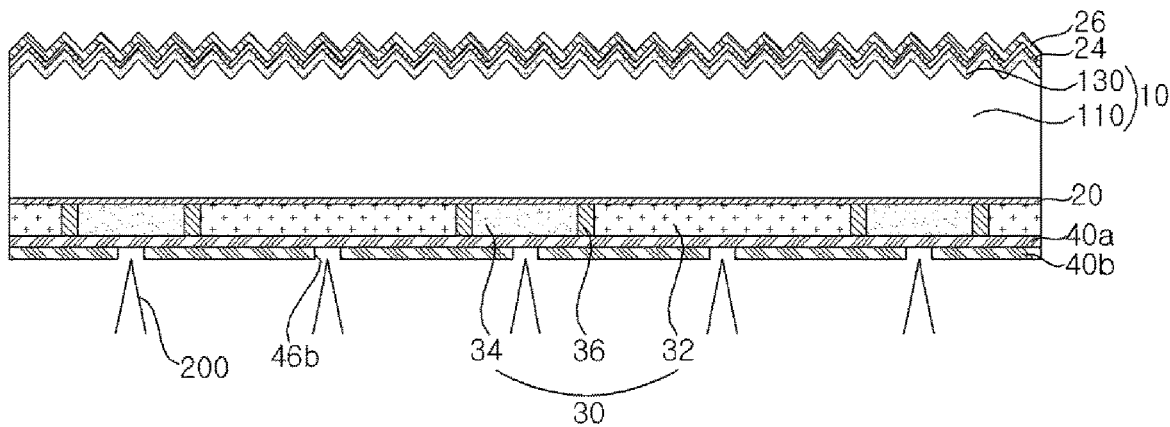

Subsequently, as illustrated in FIG. 3J by example, the first layer 40a remains unchanged, and the second contact hole region 46b is formed in the second layer 40b. Various methods may be used to form the second contact hole region 46b.

In one example, in the present embodiment, the second contact hole region 46b may be formed via laser etching using a laser 200. When using the laser etching, the second contact hole region 46b may have a small width and may be easily formed to have any of various patterns. In addition, only the second layer 40b may be selectively removed while the first layer 40a remains unchanged, depending on, for example, the kind and wavelength of the laser 200.

In the laser etching, through the use of the laser 200 which is capable of melting the second layer 40b but not capable of melting the first layer 40, the second contact hole region 46b is formed by removing a corresponding portion of the second layer 40b, but the first layer 40a remains unchanged. At this time, the laser 200 may have a specific wavelength, and thus may have a smaller band gap than the band gap of the first layer 40a and a larger band gap than the band gap of the second layer 40b. That is, because the wavelength of the laser 200 is directly associated with the band gap, the value acquired by converting the wavelength of the laser 200 into a band gap must be smaller than the band gap of the first layer 40a and greater than the band gap of the second layer 40b. For example, the band gap of the laser 200 may be calculated by dividing a value of 1.24 eV·um by the wavelength (um) of the laser 200. However, this may be changed according to, for example, the kind and characteristics of the laser 200, and therefore the embodiment of the present invention is not limited thereto.

As described above, in the present embodiment, the second contact hole region 46b may be formed only in the second layer 40b via adjustment in the band gaps of the first layer 40a and the second layer 40b. As such, the process of selectively etching only the second layer 40b while allowing the first layer 40a to remain may be easily performed.

In one example, in the laser etching, the laser 200 may have a wavelength of 1064 nm or less. This is because it is difficult to generate the laser 200 having a wavelength exceeding 1064 nm. For example, the laser 200 may have a wavelength within a range from 300 nm to 600 nm so as to ensure easy generation of laser and easy etching of the second layer 40b. In one example, the laser 200 may be an ultraviolet layer. In addition, the laser 200 may have a laser pulse width on the order of pico-seconds (ps) to nano-seconds (ns), thus enabling the efficient implementation of laser etching. In particular, the laser 200 may have a laser pulse width on the order of pico-seconds (ps) (e.g., within a range from 1 ps to 999 ps), so as to enable efficient implementation of laser etching. In addition, the laser 200 may have a laser shot mode, such as a single shot or a burst shot. The burst shot serves to divide a laser into a plurality of shots so as to emit the same. The use of the burst shot may minimize damage to the first layer 40a and the conductive areas 32 and 34. However, the embodiment of the present invention is not limited thereto, and various kinds of lasers may be used.

At this time, because the first layer 40a has a thickness within a range from 5 nm to 100 nm and has a greater band gap than the laser 200, the first layer 40a simply requires that the laser 200 passes therethrough. Thus, the first layer 40a is not damaged by the laser 200. In addition, because the intensity of the laser 200 that reaches the conductive areas 32 and 34 after passing through the first layer 40a is significantly reduced, the laser 200 cannot melt or cause damage to the conductive areas 32 and 34 even if the laser 200 or heat generated by the laser 200 reaches the conductive areas 32 and 34.

Figure 3K:
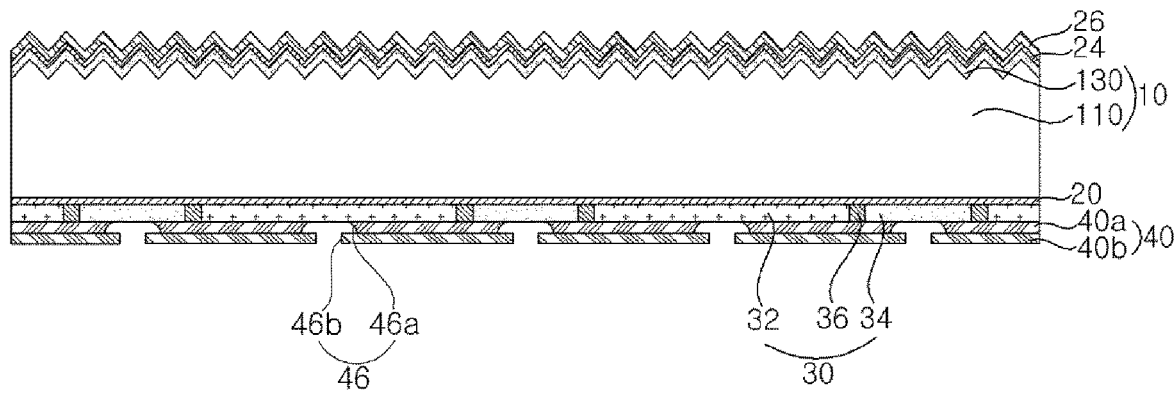

Subsequently, as illustrated in FIG. 3K by example, the first layer 40a is wet-etched using the second layer 40b as a mask, so as to form the first contact hole region 46a. That is, the first layer 40a is subjected to isotropic etching as an etchant reaches the first layer 40a through the second contact hole region 46b formed in the second layer 40b. The etchant may be selected from various materials that etch the first layer 40a, but do not etch the second layer 40b, or etch the second layer 40b at a very low rate. In one example, diluted HF or Buffered Oxide Etchant (BOE) may be used as the etchant. For example, the diluted HF may include hydrofluoric acid within a range from 0.5 wt % to 2 wt %. Although the etchant may easily etch the first layer 40a formed of, for example, an oxide, the etchant may not etch the second layer 40b formed of, for example, a nitride or a carbide, or may etch the second layer 40b at a significantly low rate. Thereby, the etchant may selectively etch only the first layer 40a.

Because the first contact hole region 46a is formed via isotropic etching as described above, the first contact hole region 46a is etched at the same rate in all directions. Thereby, the inner side surface of the first contact hole region 46a or the side surface of the first layer 40a may be a curved surface.

In addition, the first contact hole region 46a is etched to have a relatively large width or size in a region thereof adjacent to the second layer 40b and is etched to have a relatively small width or size toward conductive areas 32 and 34 spaced apart from the second layer 40b. In practice, in consideration of the fact that the etch rate is slightly faster in the thickness direction than in other directions, the width of the first contact hole region 46a at one side adjacent to the second layer 40b may be greater than the width of the first contact hole region 46a or the second contact hole region 46b at the other side adjacent to the conductive areas 32 and 34 by an amount ranging from 50% to 100% of the thickness of the first layer 40a. That is, the side surfaces of the first layer 40a and the second layer 40b (or the inner side surfaces of the first contact hole region 46a and the second contact hole region 46b) may have, at one side, a stepped portion having a width within a range from 50% to 100% of the thickness of the first layer 40a.

Figure 3L:
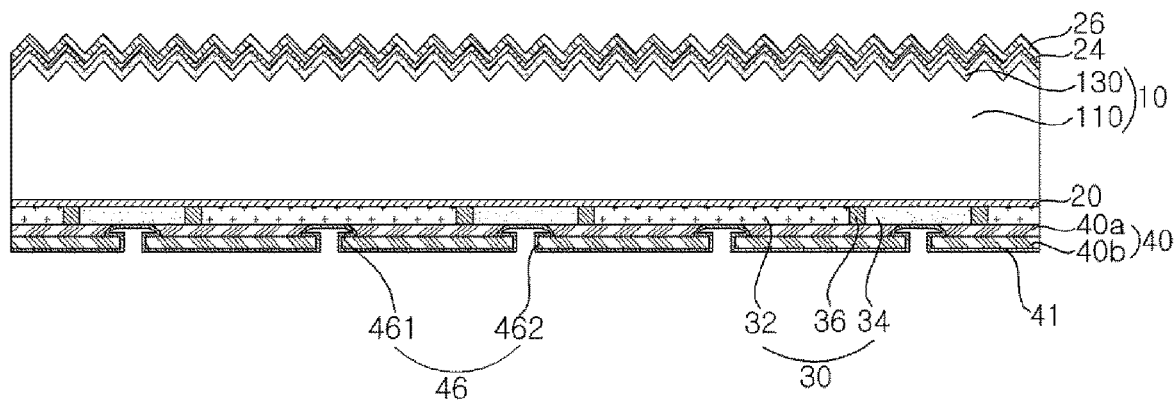

Subsequently, as illustrated in FIG. 3L by example, the protective film 41 is formed on all of the conductive areas 32 and 34 exposed through the contact hole 46, the side surface of the back passivation film 40, and the outer surface or the wide surface (the lower surface in FIG. 3L) of the passivation film 40. The protective film 41 may be formed via any of various processes.

In the present embodiment, the protective film 41 may be a silicon oxide layer formed via, for example, chemical oxidation, on all of the conductive areas 32 and 34 exposed through the contact hole 46, the side surface of the back passivation film 40, and the outer surface or the wide surface of the back passivation film 40.

In one example, the silicon oxide layer may be formed via chemical isotropic etching by dipping the lower surface of the solar cell into a nitric acid based etchant. In another example, the silicon oxide layer may be formed via chemical oxidation using hydrogen peroxide that is used in the process of washing the lower surface of the solar cell. For example, the silicon oxide layer may be formed during washing using a washing solution containing hydrogen peroxide, hydrochloric acid, and ultra-pure water. As such, the protective film 41 in the form of a silicon oxide layer may be formed without adding a separate process to the manufacturing method.

The silicon oxide layer formed via chemical oxidation as described above may be evenly formed at a small thickness within a range from about 0.5 nm to about 2 nm on all of the conductive areas 32 and 34 exposed through the contact hole 46, the side surface of the back passivation film 40, and the outer surface or the wide surface of the passivation film 40. In this way, a thin and even protective film 41 may be formed.

However, the embodiment of the present invention is not limited thereto, and a silicon oxide layer formed via, for example, thermal oxidation, or any of various layers or films formed via various other processes may be used as the protective film 41.

Figure 3M:
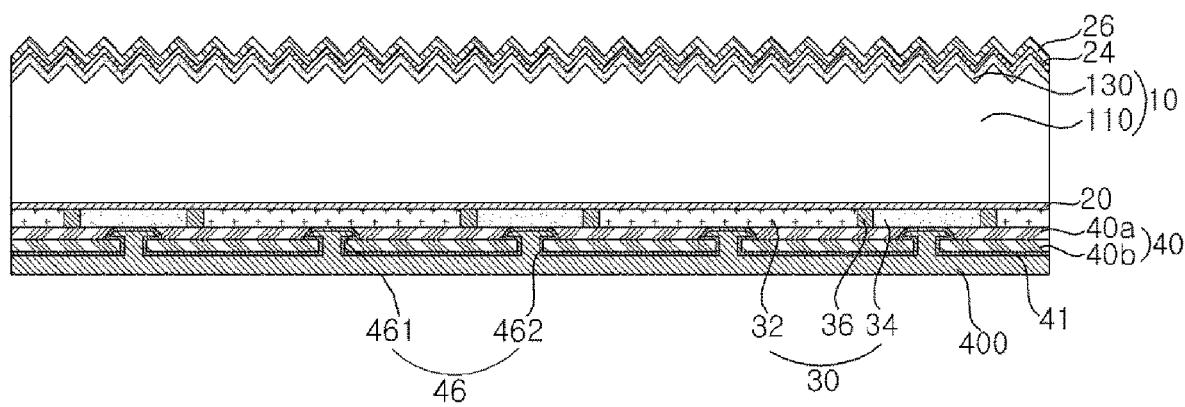
Figure 3N:
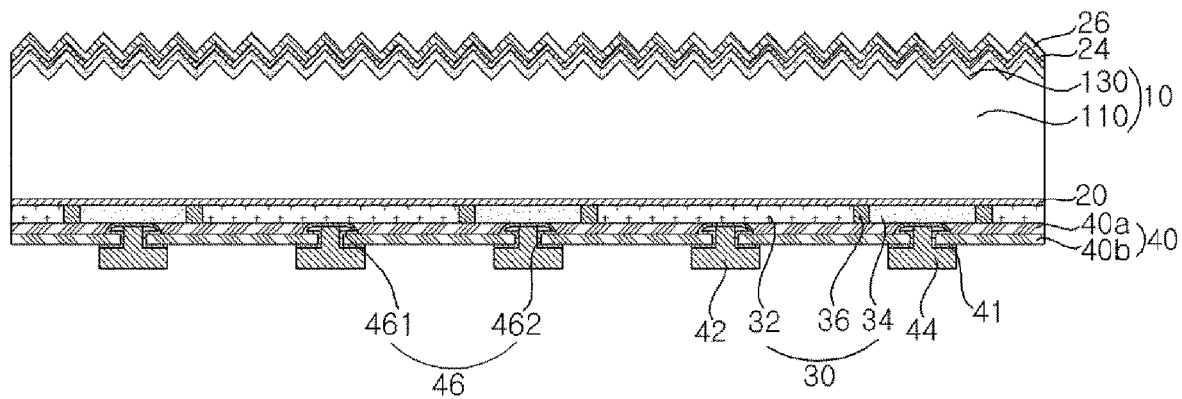

Subsequently, as illustrated in FIGS. 3M and 3N by example, the first and second electrodes 42 and 44 are formed to fill the contact hole 46.

For example, as illustrated in FIG. 3M by example, an electrode layer 400 is formed throughout the protective film 41 via, for example, sputtering or plating. The electrode layer 400 is stably and evenly formed on the back passivation film 40. The electrode layer 400 may be not formed near the side surfaces of the first layer 40a and the second layer 40b due to the stepped portion. In particular, the electrode layer 400 does not completely fill a space that is defined as the first layer 40a is retracted from or recessed in the second layer 40b or as a portion of the first contact hole region 46a adjacent to the second layer 40b is expanded, whereby an empty space (see reference numeral V in FIG. 1) may be located between the protective film 41 and the first and second layers 40a and 40b. However, the embodiment of the present invention is not limited thereto, and no empty space V may be defined.

The electrode layer 400 may be formed of any of various known materials (e.g. silver, gold, copper, or aluminum).

Subsequently, as illustrated in FIG. 3N by example, the electrode layer 400 is patterned using an etchant or etching paste which is capable of patterning the electrode layer (see reference numeral 400 in FIG. 3M). Thereby, the electrodes 42 and 44 are formed. Because the protective film 41 is thin as described above, the portion of the protective film 41, corresponding to the portion of the electrode layer 400 to be removed during the patterning of the electrode layer 400, may be removed. Thereby, only the portion of the protective film 41 at which the electrodes 42 and 44 are located remains.

In the present embodiment, the first layer 40a may prevent the conductive areas 32 and 34 from being damaged by the laser 200 when the second contact hole region 46b is formed, and the first contact hole region 46a may be formed using an etchant that has no function of etching the conductive areas 32 and 34. This may minimize damage to the conductive areas 32 and 34 that might otherwise occur when the contact hole 46 is formed. Then, the protective film 41 is formed to cover the location at which the contact hole 46 is formed, whereby passivation of the conductive areas 32 and 34 may be improved at the location of the contact hole 46. In addition, because the protective film 41 is located over the contact hole 46 when the first and second electrodes 42 and 44 or the electrode layer 400 is formed, the conductive areas 32 and 34 are not exposed to the outside. Accordingly, it is possible to prevent damage to the conductive areas 32 and 344 in the process of forming the first and second electrodes 42 and 44. In this way, the solar cell 100 having excellent characteristics and efficiency may be manufactured.

Hereinafter, a solar cell and a method of manufacturing the same in accordance with other embodiments of the present invention will be described in detail with reference to FIGS. 4 to 8. A detailed description of elements that are the same or extremely similar to those described above will be omitted. Embodiments combining the embodiment and alterations described above with the embodiment and alterations to be described below also fall within the scope of the embodiment of the present invention.

Figure 4:
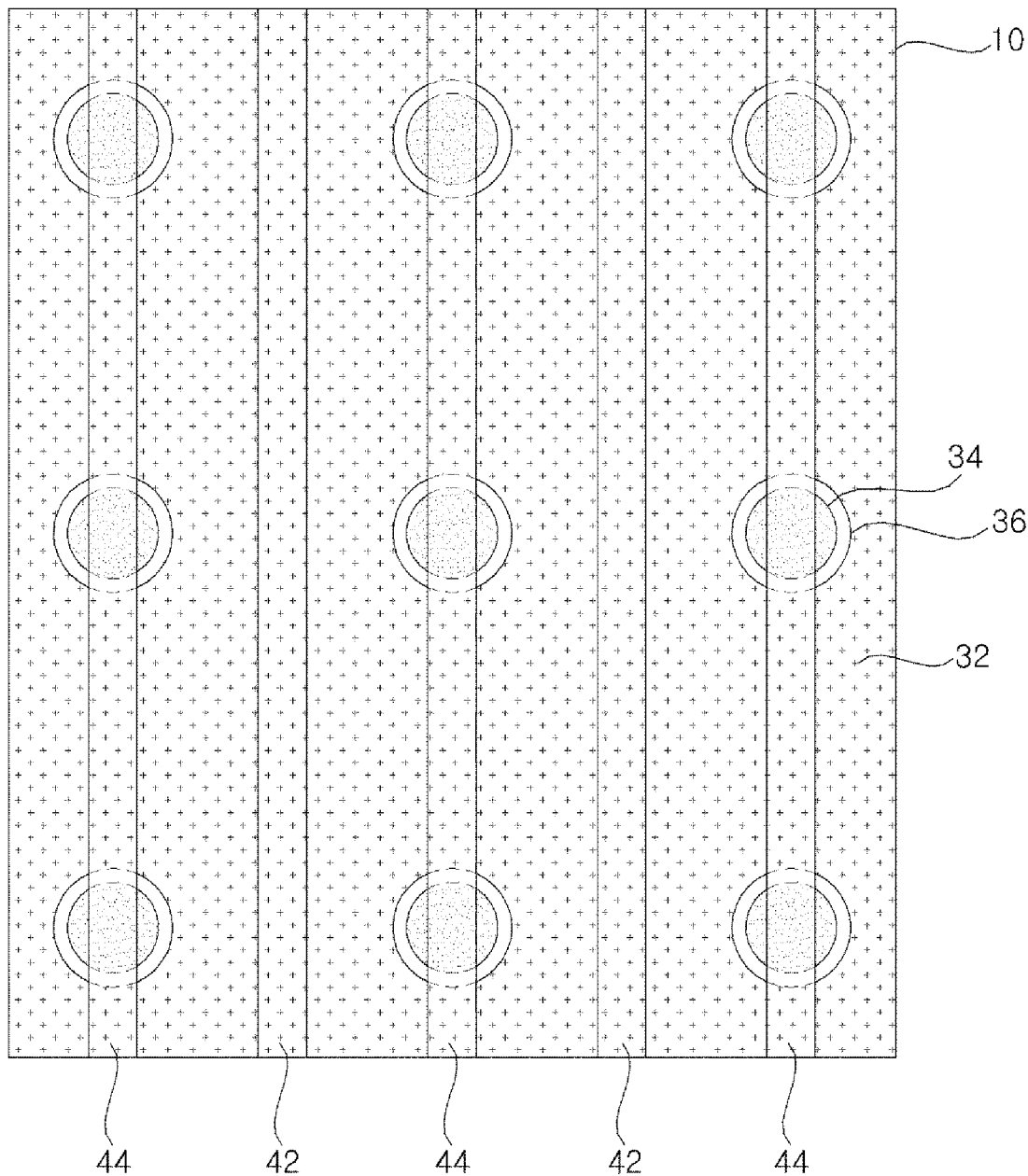
FIG. 4 is a partial rear plan view of a solar cell in accordance with another embodiment of the present invention.

FIG. 4 is a partial rear plan view of a solar cell in accordance with another embodiment of the present invention. In FIG. 4, the illustration of the back passivation film (see reference numeral 40 in FIG. 1) is omitted, and the first and second conductive areas 32 and 34, the barrier area 36, and the first and second electrodes 42 and 44 are mainly illustrated. Although no additional illustration or description is provided, in the present embodiment, the back passivation film 40 is located between the first and second conductive areas 32 and 34, the barrier area 36, and the first and second electrodes 42 and 44. In addition, the portion of the back passivation film 40 at which the first conductive area 32 and the first electrode 42 overlap each other may be formed with the contact hole (see reference numeral 46 in FIG. 1) for connecting the first conductive area 32 to the first electrode 42, and the portion of the back passivation film 40 at which the second conductive area 34 and the second electrode 44 overlap each other may be formed with the contact hole (see reference numeral 46 in FIG. 1) for connecting the second conductive area 34 to the second electrode 44.

Referring to FIG. 4, in the solar cell 100 in accordance with the present embodiment, a plurality of second conductive areas 34 may take the form of islands spaced apart from one another, and the first conductive area 32 may be formed throughout the entire area except for the second conductive areas 34 and the barrier areas 36 surrounding the second conductive areas 34.

As such, the first conductive area 32, which functions as an emitter area, may have the maximum area, which may improve photoelectric conversion efficiency. In addition, it is possible to distribute the second conductive areas 34 in the entire semiconductor substrate 10 while minimizing the area of the second conductive areas 34. As a result, it is possible to maximize the area of the second conductive areas 34 while effectively preventing surface recombination by the second conductive areas 34. However, the embodiment of the present invention is not limited thereto, and of course, the second conductive areas 34 may have any of various other shapes so long as they can have the minimum area possible.

Although FIG. 4 illustrates the second conductive areas 34 as having a circular shape, the embodiment of the present invention is not limited thereto. Thus, of course, the second conductive areas 34 may have an elliptical shape or a polygonal shape such as, for example, a triangular shape, a rectangular shape, or a hexagonal shape.

Figure 5:
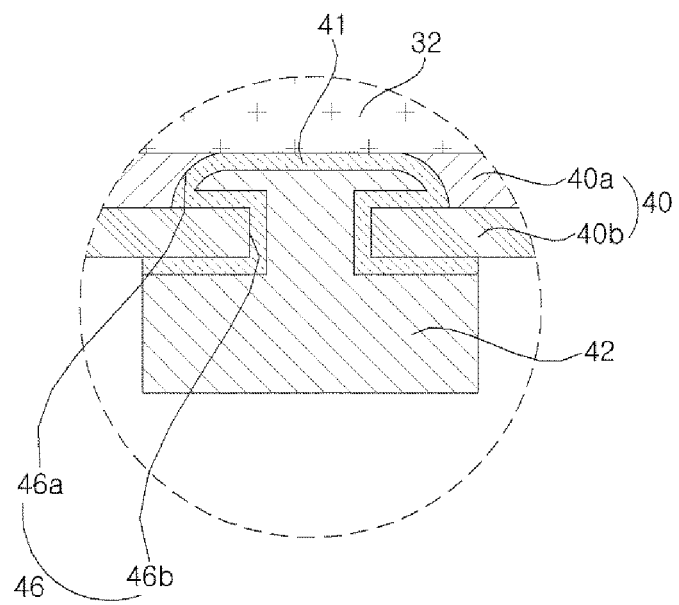
FIG. 5 is a sectional view illustrating a portion of a solar cell in accordance with another embodiment of the present invention.

FIG. 5 is a sectional view illustrating a portion of a solar cell in accordance with another embodiment of the present invention. For clear and simplified illustration, FIG. 5 illustrates the portion corresponding to the enlarged circle in FIG. 1.

Referring to FIG. 5, in the present embodiment, the first electrode 42 may be formed over the entire protective film 41 within the first contact hole region 46a and the second contact hole region 46b. In one example, the first electrode 42 is formed so as to completely fill the first contact hole region 46a and the second contact hole region 46b. Thereby, even when the side surface of the first layer 40a and the second layer 40b has, for example, a stepped portion or a bent portion, the protective film 41 may be formed so as to come into (close) contact with the entire side surface of the first layer 40a and the second layer 40b and the surface of the first conductive area 32, and in turn the first electrode 42 may be formed over the protective film 41 so as to come into (close) contact with the entire protective film 41. In this way, the first electrode 42 may completely fill the contact hole 46 above the protective film 41 so that no empty space v is present between the first electrode 42 and the side surface of the contact hole 46. This is because the first electrode 42 may be formed so as to completely fill the contact hole 46 above the protective film 41 according to, for example, process conditions. This may increase the volume and density of the first electrode 42, thereby reducing resistance. In addition, the protective film 41 may also be disposed between the outer surface of the second layer 40b (opposite to the first layer 40a) and the first electrode 42.

Although FIG. 5 and the above description are focused on the first electrode 42 and the first conductive area 32, the above description may be directly applied to the second electrode (see reference numeral 44 in FIG. 1) and the second conductive area (see reference numeral 34 in FIG. 1).

Figure 6:
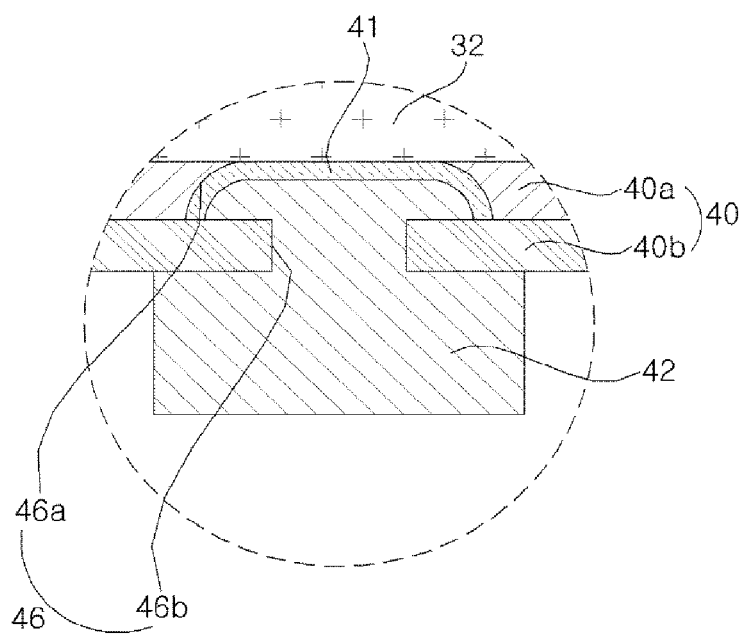
FIG. 6 is a sectional view illustrating a portion of a solar cell in accordance with another embodiment of the present invention.

FIG. 6 is a sectional view illustrating a portion of a solar cell in accordance with another embodiment of the present invention. For clear and simplified illustration, FIG. 6 illustrates the portion corresponding to the enlarged circle in FIG. 1.

Referring to FIG. 6, in the present embodiment, the protective film 41 is formed so as to cover (or to be in contact with) the first conductive area 32 and the first layer 40a, but is not formed so as to cover the second layer 40b.

For example, the protective film 41 may include a portion disposed on (e.g., in contact with) the bottom surface of the contact hole 46 (i.e. the surface of the conductive areas 32 and 34 exposed through the contact hole 46), and a portion disposed on (e.g., in contact with) the side surface of the first contact hole region 46a or the first layer 40a. In addition, the protective film 41 is not formed on the side surface of the second contact hole region 46b or the second layer 40b, on the inner surface of the second layer 40b (adjacent to the first layer 40a or the first conductive area 32), and on the outer surface of the second layer 40b (opposite to the inner surface).

This is because the surface of the first conductive area 32 may include a semiconductor material (e.g. silicon) and may be easily oxidized by reacting with oxygen, and therefore the protective film 41 may be easily formed when it includes a silicon oxide. In addition, this is because the protective film 41 may be easily formed over the first layer 40a when the first layer 40a includes an oxide (e.g. a silicon oxide) or an amorphous semiconductor material (e.g. amorphous silicon), and thus the protective film 41 is formed of a silicon oxide. This is because, when the first layer 40a includes a silicon oxide, the protective film 41 including the same material as the first layer 40a may be easily formed, and because, when the first layer 40a includes an amorphous silicon, the first layer 40a may easily react with oxygen, thereby forming the protective film 41 formed of a silicon oxide. On the other hand, because the second layer 40b includes a nitride or a carbide, the second layer 40b is already chemically stabilized to some extent even if it includes a silicon nitride or a silicon carbide, and therefore it may be difficult to form the protective film 41 using a completely different material, e.g., a silicon oxide.

Although FIG. 6 and the above description are focused on the first electrode 42 and the first conductive area 32, the above description may be directly applied to the second electrode (see reference numeral 44 in FIG. 1) and the second conductive area (see reference numeral 34 in FIG. 1).

Figure 7:
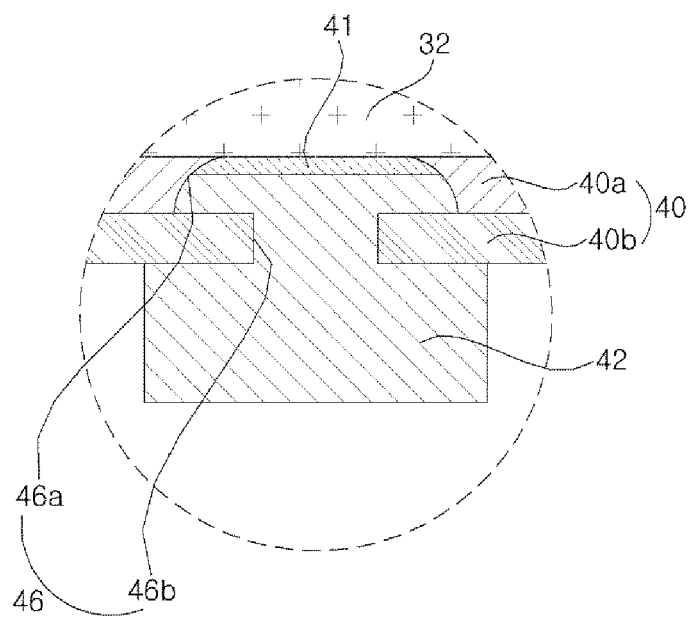
FIG. 7 is a sectional view illustrating a portion of a solar cell in accordance with another embodiment of the present invention.

FIG. 7 is a sectional view illustrating a portion of a solar cell in accordance with another embodiment of the present invention. For clear and simplified illustration, FIG. 7 illustrates the portion corresponding to the enlarged circle in FIG. 1.

Referring to FIG. 7, in the present embodiment, the protective film 41 is formed so as to cover the first conductive area 32, but is not formed so as to cover the first layer 40b, or is formed so as to only cover a portion thereof. In addition, the protective film 42 is not formed so as to cover the second layer 40b.

For example, the protective film 41 may include a portion disposed on (e.g., in contact with) the bottom surface of the contact hole 46 (e.g., the surface of the conductive areas 32 and 34 exposed through the contact hole 46). In addition, a portion of the protective film 41 may be formed on (e.g., in contact with) the side surface of the first contact hole region 46a or the first layer 40a at the location at which it comes into contact with the bottom surface of the contact hole 46. Alternatively, the protective film 41 may be locally formed only over the first conductive area 32 corresponding to the contact hole 46, and may not come into contact with the side surface of the first contact hole region 46a. Thereby, the protective film 41 is not formed throughout the side surface of the first contact hole region 46a or the first layer 40a. In addition, the protective film 41 is not formed on the side surface of the second contact hole region 46b or the second layer 40b, on the inner surface of the second layer 40b (adjacent to the first conductive area 32 or the first layer 40b), and on the outer surface of the second layer 40b (opposite to the inner surface).

As described above, the surface of the first conductive area 32 may include a semiconductor material (e.g. silicon) and may be easily oxidized by reacting with oxygen, whereby the protective film 41 formed of a silicon oxide may be formed. In addition, the first layer 40a may be thin and the protective film 41 may be not formed on the side surface of the first layer 40a due to the presence of the under-cut or various process conditions. In addition, the protective film 41 may be not formed on the second layer 40b due to the same reason as that described with reference to FIG. 6.

Although FIG. 7 and the above description are focused on the first electrode 42 and the first conductive area 32, the above description may be directly applied to the second electrode (see reference numeral 44 in FIG. 1) and the second conductive area (see reference numeral 34 in FIG. 1).

As described above, in the present embodiment, the protective film 41 is formed after the contact hole 46 is formed, and thus is not disposed between the passivation film 40 and the conductive areas 32 and 34. In addition, the electrodes 42 and 44 may be spaced apart from the conductive areas 32 and 34 with the protective film 41 interposed therebetween.

FIG. 7 and the above description illustrate that the protective film 41 has a clear boundary with the first layer 40a and the protective film 41 and the first layer 40a are configured as completely different layers. However, the protective film 41 and the first layer 40a may include the same material (e.g. a silicon oxide). In this instance, there may be no boundary between the protective film 41 and the first layer 40a. In this instance, it may be determined or measured that a thin first layer 40a or silicon oxide layer is formed so as to cover (or to be in contact with) the conductive areas 32 and 34 at the location at which the contact hole 46 is formed, and a thick first layer 40a or silicon oxide layer is formed at the location at which the contact hole 46 is not formed. In the embodiments of FIGS. 1 and 5, it may be determined or measured that the first layer 40a or the silicon oxide layer is additionally extended between the second layer 40b and the electrodes 42 and 44.

Figure 8:
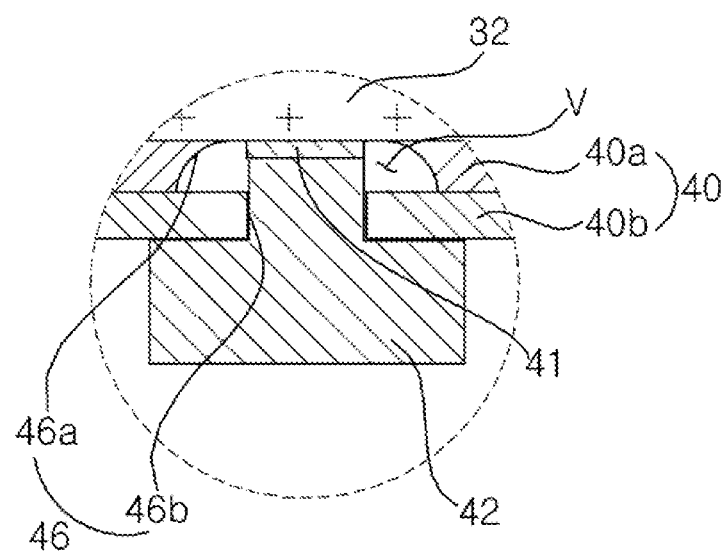
FIG. 8 is a sectional view illustrating a portion of a solar cell in accordance with a further embodiment of the present invention.

FIG. 8 is a sectional view illustrating a portion of a solar cell in accordance with a further embodiment of the present invention. For clear and simplified illustration, FIG. 8 illustrates the portion corresponding to the enlarged circle in FIG. 1.

Referring to FIG. 8, in the present embodiment, the protective film 41 includes a portion disposed on (e.g. in contact with) the bottom surface of the contact hole 46 (e.g., the surface of the conductive areas 32 and 34 exposed through the contact hole 46).

In the present embodiment, the protective film 41 is not formed on the surface of the second layer 40b of the back passivation film 40 opposite to the first conductive area 32. This is because it may be difficult to form the protective film 41 on the surface of the second layer 40b opposite to the first conductive area 32 at the location of the first contact hole region 46a below the second layer 40b. Alternatively, the protective film 41 need not be formed on the surface of the first conductive area 32 and/or the side surface of the first contact hole region 46a, which is located below the second layer 40b in the first contact hole region 46a. This is because it may be difficult to form the protective film 41 on the corresponding surface during the manufacturing process. As such, the protective film 41 need not be formed on the part of the first contact hole region 46a that is adjacent to the empty space V located below the second layer 40b.

Alternatively, the protective film 41 may be not formed on the side surface of the second layer 40b and/or the surface of the second layer 40b opposite to the electrodes 42 and 44 (e.g., the first electrode 42 in FIG. 8 and/or the second electrode 44 illustrated in FIG. 1). This is because the protective film 41 is removed intentionally or in another process before the electrodes 42 and 44 are formed, or because the protective film 41 is formed to have a given pattern using, for example, a mask so that the protective film 41 is not formed at the corresponding portion.

Although FIG. 8 illustrates the protective film 41 as being formed only on the first conductive area 32 so as to correspond to the location at which the electrodes 42 and 44 are formed, the protective film 41 may be formed on, for example, the portion adjacent to the empty space V, the side surface or the surface of the second layer 40b.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:

1. A solar cell comprising:
   a semiconductor substrate;
   a conductive area formed on a surface of the semiconductor substrate;
   a passivation film including a first layer directly formed on the conductive area and having a first contact hole and a second layer directly formed on the first layer and having a second contact hole having a size smaller than a size of the first contact hole;
   an electrode electrically connected to the conductive area through the first and second contact holes, wherein the electrode comprises a first electrode region filled in the first contact hole to form an empty space between the first layer and the electrode and a second electrode region filled in the second contact hole not to form an empty space between the second layer and the electrode; and
   a silicon oxide film formed on an interface between the conductive area and the first electrode region thereby preventing a direct contact of the conductive area and the first electrode region.

2. The solar cell according to claim 1, wherein the conductive area comprises a first conductive area and a second conductive area formed on the surface of the semiconductor substrate, and
   wherein the solar cell further comprises a barrier area formed on the surface of the semiconductor substrate, and located between the first conductive area and the second conductive area.

3. The solar cell according to claim 1, wherein the electrode further comprises a third electrode region that is outside of the first and second contact holes, and wherein the third electrode region is formed on the first and second layers so that the third electrode region overlaps the first and second layers.

4. The solar cell according to claim 1, wherein the empty space is formed only in the first layer.

* * * * *